United States Patent [19]
Yoshitani et al.

[11] Patent Number: 6,021,790
[45] Date of Patent: Feb. 8, 2000

[54] SUBSTRATE TREATING APPARATUS AND METHOD FOR TREATING SUBSTRATE

[75] Inventors: Mitsuaki Yoshitani; Eiichi Wada; Makoto Mori; Iwao Tanaka; Yoshihiko Matsushita, all of Hikone, Japan

[73] Assignee: Dainippon Screen Mfg. Co.,Ltd., Japan

[21] Appl. No.: 08/760,643

[22] Filed: Dec. 4, 1996

[30] Foreign Application Priority Data

Dec. 4, 1995 [JP] Japan .................................... 7-315675
Dec. 4, 1995 [JP] Japan .................................... 7-344610
Feb. 27, 1996 [JP] Japan .................................... 8-039742

[51] Int. Cl.⁷ .................................................. B08B 3/02
[52] U.S. Cl. .......................... 134/62; 134/66; 134/64 R; 134/122 R; 198/373
[58] Field of Search .............................. 134/62, 66, 64 R, 134/122 R, 83; 198/373, 375, 376, 401, 406, 407; 414/425

[56] References Cited

U.S. PATENT DOCUMENTS

| | | |
|---|---|---|
| 3,675,665 | 7/1972 | Sadwith . |
| 3,871,394 | 3/1975 | Thegerstrom . |
| 4,079,919 | 3/1978 | Schober et al. . |
| 4,311,266 | 1/1982 | Kondo . |
| 4,641,672 | 2/1987 | Lewbart . |
| 4,732,172 | 3/1988 | Pedersen . |
| 5,609,237 | 3/1997 | Lenhart . |
| 5,795,405 | 8/1998 | Harnden et al. . |

FOREIGN PATENT DOCUMENTS

| | | |
|---|---|---|
| 5-277450 | 10/1993 | Japan . |
| 6-87338 | 12/1994 | Japan . |
| 7-283185 | 10/1995 | Japan . |

*Primary Examiner*—Frankie L. Stinson
*Attorney, Agent, or Firm*—Ostrolenk, Faber, Gerb & Soffen, LLP

[57] ABSTRACT

A substrate treating apparatus for successively treating substrates includes a body having a carrying unit for carrying the substrate along a carrying surface. The carrying surface is inclined in a plane perpendicular to the carrying direction of the substrate. The body supplies a treating liquid to the substrate being carried for treating the substrate. A receiving station is disposed upstream of the body for changing the posture of the substrate from a horizontal posture to an inclined posture corresponding to the inclination of the carrying surface, and for forwarding the substrate onto the carrying unit. In addition, a delivering station is disposed downstream of the body for returning the substrate forwarded from the carrying unit in the inclined posture to the horizontal posture.

40 Claims, 15 Drawing Sheets

SUBSTRATE TREATING APPARATUS AND METHOD FOR TREATING SUBSTRATE

BACKGROUND OF THE INVENTION AND RELATED ART STATEMENT

The present invention relates to a substrate treating apparatus for use with glass substrates (base plates) for liquid crystals and photomasks, etc. on the surfaces of which thin films such as of a photoresist coating solution, a photosensitive polyimide resin and dyestuffs for color filters are to be formed. The apparatus supplies a given treating liquid to the principal planes of those substrates for desired treatment.

There has been known as a conventional technology of a substrate treating apparatus wherein a substrate having been subjected to certain treatment in the preceding step is carried to the next step after being cleaned with a cleaning chemical. Such a substrate treating apparatus generally comprises an apparatus body including a chemical cleaning station, a water cleaning station and a drying station arranged in series, and substrate carrying means provided to extend through the chemical cleaning, the water cleaning and the drying stations.

Conventionally, the carrying means is designed to carry a substrate in a horizontal posture and the substrate is treated while being carried by the carrying means through the chemical cleaning station, the water cleaning station and the drying station of the treating apparatus body in the named order. Specifically, a chemical cleaning process is first performed on the substrate, transported into the treating apparatus body, in the chemical cleaning station by supplying a given chemical to the front and rear surfaces of the substrate. Then, after removing the chemical, a water cleaning process is performed on the substrate in the water cleaning station. Finally, a drying process is performed in the drying station by, e.g., spraying gas to the substrate.

When the substrate is carried from the chemical cleaning station to the water cleaning station, it is moved toward the water cleaning station while the chemical on the substrate is removed by an air knife or the like, so that the chemical and the cleaning water are prevented from mixing with each other on the substrate. In the water cleaning station, a finish cleaning process is usually performed on the substrate as a final step using pure water. At this time, water wiping is also performed by an air knife or the like so that the usual cleaning water on the upstream side and the pure water on the downstream are prevented from being mixed with each other on the substrate.

Meanwhile, it has been recently proposed to carry a substrate in an inclined posture through the treating apparatus body. With this proposal, the treating liquid supplied to the substrate flows down fast over the substrate slopes and is diminished quickly. Therefore, the treating liquid on the upstream side and the treating liquid on the downstream side are surely prevented from being mixed with each other on the substrate, and hence the liquid removing step using an air knife or the like can be dispensed with. This contributes to a reduction in the equipment cost.

However, because the substrate is carried into an inlet of the treating apparatus body in a horizontal posture and discharged from an outlet of the treating apparatus body to the next step in a horizontal posture, it is required not only to automatically change the posture of the substrate having been carried in the horizontal posture to an inclined posture upstream of the treating apparatus body for transfer to the carrying unit in the treating apparatus body, but also to automatically return the substrate from the inclined posture to the original horizontal posture downstream of the treating apparatus body. Unless the technique realizing the requirements is established, the above proposal of cleaning the substrate while carrying it in the inclined posture through the treating apparatus body, cannot be applied to the practical use. Nevertheless, that technique has not yet been established at the present.

SUMMARY OF THE INVENTION

An object of the present invention is to provide an apparatus and a method for treating a substrate with which the posture of the substrate can be surely changed between a horizontal posture and an inclined posture upstream and downstream of a body of the substrate treating apparatus, and the substrate can be treated with a treating liquid efficiently while it is carried in the inclined posture through the treating apparatus body.

Another object of the present invention is to provide an apparatus and a method for treating a substrate with which the posture of the substrate can be changed without reducing the treatment efficiency.

To fulfill the above objects, the substrate treating apparatus according to the present invention for treating the substrates successively, comprises a body including carrying unit for carrying the substrate along a carrying surface which is inclined in a plane perpendicular to the carrying direction of the substrate, the body supplying a treating liquid to the substrate being carried, thereby treating the substrate, a receiving station disposed upstream of the body for changing the posture of the substrate forwarded in a horizontal posture to an inclined posture corresponding to the inclination of the carrying surface and then forwarding the substrate onto the carrying means in the body, and a delivering station disposed downstream of the body for returning the posture of the substrate from the inclined posture to the horizontal posture.

Also, to fulfill the above objects according to the present invention, a method for treating a substrate in which a treating liquid is supplied to substrates being carried by carrying means having a carrying surface which is inclined in a plane perpendicular to the carrying direction of the substrate, thereby treating the substrates successively, comprises the steps in that a substrate forwarded in a horizontal posture is changed to an inclined posture corresponding to the inclination of the carrying surface and is forwarded to the carrying means, and the substrate in the inclined posture having been subjected to treatment is returned to the horizontal posture and forwarded to a succeeding step.

With the above arrangement, the substrate can be smoothly transferred to the inclined carrying means in the body and can be smoothly received from the carrying means. In other words, as compared with the case that the substrate posture is not changed at the inlet and outlet of the body, with aforementioned arrangement, the whole substrate carrying path is not required to be inclined, the invention can be practiced by inclining the substrate carrying path only in a section of treatment without considerably modifying the existing equipment specifications, and the equipment cost can be reduced effectively.

Because the substrate is carried in the inclined posture by the carrying means through the body, a treating liquid such as a cleaning chemical supplied to the substrate can be replaced and removed satisfactorily. As compared with the case of employing carrying means to carry the substrate in the horizontal posture, the treating time can be shortened and the space and means necessary for removing the liquid can be minimized. It is hence possible to surely suppress an increase in size of substrate treating apparatus resulting from an enlarged substrate size.

Preferably, the carrying surface defined by the carrying means is inclined in the range of 3° to 40° relative to a horizontal direction in the plane perpendicular to the carrying direction of the substrate.

With the carrying surface inclined at an angle within the above range, the substrate can be carried in a stable state. Also, by setting the inclination angle of the substrate to fall in the above range in consideration of the kind of the treating liquid, the viscosity of the treating liquid, the amount of the treating liquid supplied, the carrying speed of the substrate, etc., the treating liquid can be replaced and removed satisfactorily, while preventing the surface of the substrate from drying up and ensuring a sufficient treating effect.

The receiving station and the delivering station may each comprise a plurality of carrying members arranged side by side in the carrying direction for moving the substrate in the carrying direction, a support member for supporting the carrying members, drive means for driving the carrying members, and posture changing means for changing the support member from a first posture (a horizontal posture for the support member in the receiving station and an inclined posture for the support member in the delivering station; this is equally applied to the following description), which corresponds to the posture of the substrate on the upstream side, to a second posture (an inclined posture for the support member in the receiving station and a horizontal posture for the support member in the delivering station; this is equally applied to the following description).

It may be appreciated that posture restoring means is constructed to return the plurality of carrying members set to the second posture to the first posture independently of each other, and actuating the posture restoring means so as to successively return the carrying members which have been passed by the substrate from the second posture to the first posture one by one. With this arrangement, it is possible to advance the succeeding substrate onto the carrying members having been returned to the first posture and shorten the tact time or cycle of the substrate treatment correspondingly.

Preferably, the posture restoring means are constituted by cylinder devices and piston rods of the cylinder devices are set free of displacement with respect to the cylinders while the carrying members are changed from the first posture to the second posture by the posture changing means.

With this feature, when the carrying members are changed from the first posture to the second posture by the posture changing means, the piston rods of the cylinder devices as the posture restoring means can be freely moved following the posture change.

It may be also appreciated that the posture actuating members may be actuated so as to return the carrying members from the second posture to the first posture successively one by one from the upstream side.

With this arrangement, it is possible to move the succeeding substrate onto the unit carrying means (carrying members) having been returned to the first posture before all the unit carrying means are returned to the first posture, and therefore shorten the tact time or cycle of the substrate treatment correspondingly.

Furthermore, the apparatus may be arranged such that the carrying members are formed by carrying rollers, the support member is formed by a roller mount on which the plurality of carrying rollers are arranged side by side in the carrying direction of the substrate to be rotatable about the axes of respective roller shafts, and the posture changing means is formed by a main cylinder device having a piston rod which is extended out or contracted into a cylinder to change the roller mount between a first (horizontal) posture and a second (inclined) posture, the roller mount being rotatably supported at one side thereof by a horizontal shaft extending in the carrying direction of the substrate.

With this feature, the carrying rollers can be changed in posture together at one time by operation of the main cylinder device. In addition, the carrying rollers can be changed in posture individually by operation of respective sub-cylinder devices.

The roller shafts may be supported in a free state by a side edge of the roller mount opposing to the side of the horizontal shaft.

With this feature, the carrying members having been changed in posture together at a time by actuating the main cylinder device so as to turn the roller mount about the axis of the horizontal shaft to thereby raise side edges of the roller shafts, can be maintained in the second posture by the sub-cylinder devices even after reversely actuating the main cylinder device to turn the roller mount backward in a state where piston rods of the sub-cylinder devices are held projected upward. Accordingly, the carrying rollers supported by only the respective sub-cylinder devices can be returned to the first posture one by one by actuating the sub-cylinder devices individually.

It may be appreciated that the ends of the roller shafts on the side of the horizontal shaft are connected to the drive means through flexible couplings.

With this feature, the driving force of the drive means can be surely transmitted to the carrying means regardless of change in the posture of the roller mount.

Additionally, the posture restoring means may include detecting means for detecting that the rear end of the substrate has passed the corresponding carrying members, and one or more of carrying members which have been passed by the substrate may be changed from the second posture to the first posture in accordance with the detection of passage of the substrate by the detecting means.

With this feature, whenever the rear end of the substrate has passed the carrying member, that carrying member is automatically returned to the first posture by the posture restoring means under control of control means. As a result, efficient automatic carrying of substrates into and out of the body can be realized.

These and other objects, features and advantages of the invention will become more apparent upon reading the detailed description of the preferred embodiment with reference to the appended drawings.

BRIEF DESCRIPTION OF THE DRAWINGS

FIGS. 8 to 11 are perspective views, partly cut away, showing a substrate introducing section of a second embodiment, in which:

FIG. 8 shows a state where the carrying surface of a substrate transfer section is set to a horizontal posture, FIG. 9 shows a state where the carrying surface of the substrate transfer section is set to an inclined posture by raising a piston rod of a main cylinder, FIG. 10 shows a state where the carrying surface of the substrate transfer section is set to an inclined posture by raising piston rods of all sub-cylinders, and FIG. 11 shows a state where the piston rod of a first sub-cylinder only is lowered in the state shown in FIG. 10.

FIG. 15 is a view for explaining the carrying time (tact time) of each substrate over the substrate transfer section.

DETAILED DESCRIPTION OF THE PREFERRED EMBODIMENT OF THE INVENTION

Figure 1:
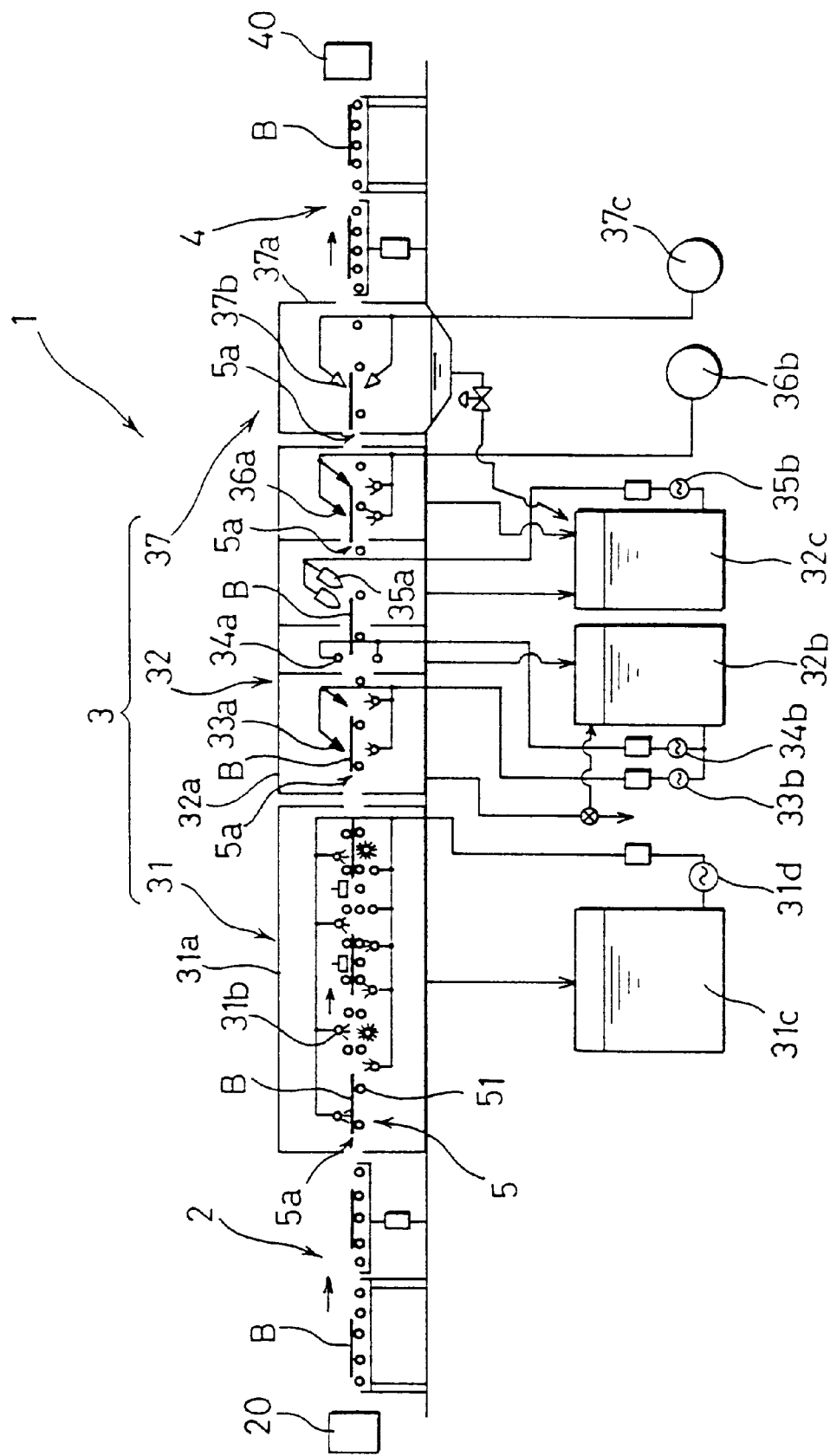
FIG. 1 is an explanatory view showing a first embodiment of a substrate treating apparatus according to the present invention.

FIG. 1 is an explanatory view showing a first embodiment of a substrate treating apparatus according to the present invention. As shown in FIG. 1, a substrate treating apparatus 1 is constructed by arranging in series a substrate introducing station 2 for receiving a substrate B sent from a preceding step, a treating apparatus body 3 having a treating space for the substrate B defined therein, and a substrate delivering station 4 for transferring the substrate B after treatment to a succeeding step. In the substrate treating apparatus 1, the substrate B is subjected to treatment while it is carried through the substrate introducing (receiving) station 2, the treating apparatus body 3 and the substrate delivering (discharging) station 4 in the order named.

In this embodiment, a roller conveyor is employed as a carrying unit 5. The roller conveyor is constructed by arranging a plurality of rollers 51 side by side with equal pitches in a carrying direction of the substrate B (i.e., a direction toward the right from the left in FIG. 1), support shafts of the rollers 51 being oriented in a direction perpendicular to the carrying direction of the substrate B. By placing the substrate B on the carrying unit 5 under operation, the substrate B is carried in the carrying direction (to the right in FIG. 1) with synchronous rotation of the rollers 51 effected by driving of drive unit (not shown).

The substrate B is transferred from the preceding step to the substrate introducing station 2 through an upstream transfer unit 20 such as a conveyor or a robot, and then introduced from the substrate introducing station 2 in to the treating apparatus body 3 with the operation of the carrying unit 5. The substrate B is subjected to cleaning treatment while it is carried by the carrying unit 5 through the treating apparatus body 3, followed by transfer to the substrate delivering station 4. After that, the substrate B is delivered from the downstream end of the substrate delivering station 4 to the next step through a downstream transfer unit 40 such as a conveyor or a robot.

Figure 2:
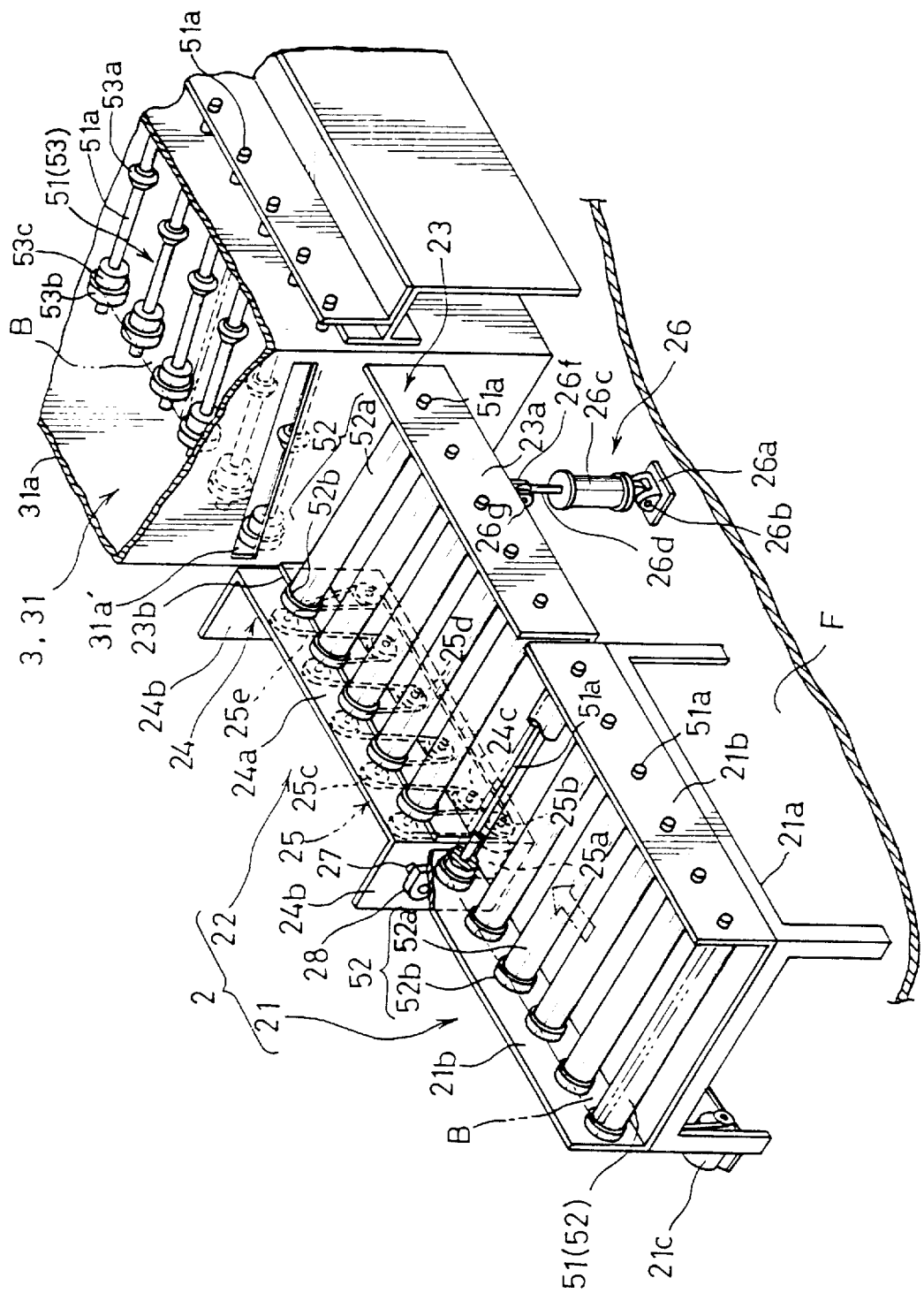
FIG. 2 is a perspective view, partly cut away, of a first embodiment of a substrate introducing station, the view showing a state where a substrate transfer section is set to a horizontal posture.
Figure 3:
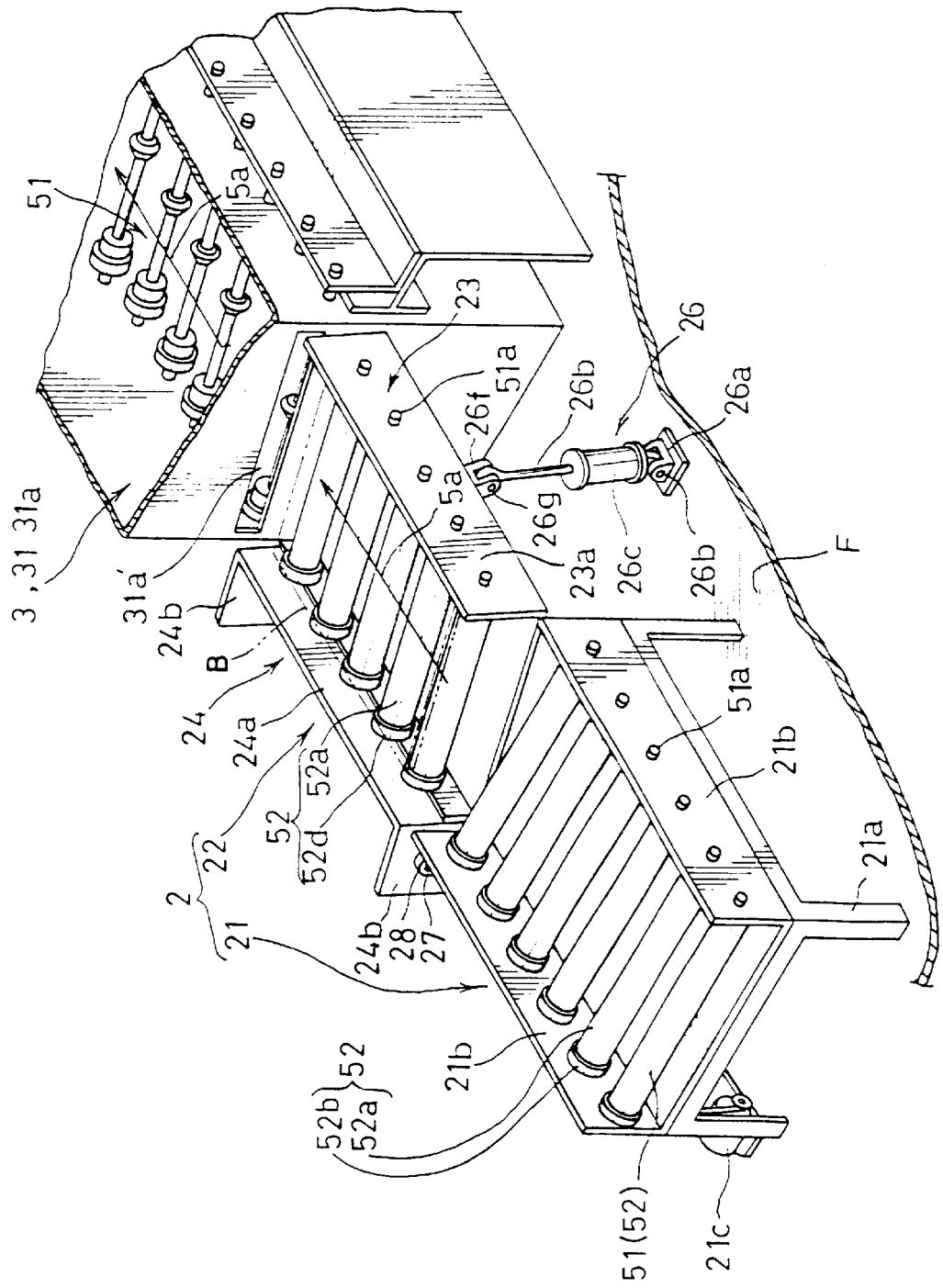
FIG. 3 is a perspective view, partly cut away, of the first embodiment of the substrate introducing station, the view showing a state where the substrate transfer section is set to an inclined posture.

In the treating apparatus body 3, the rollers 51 are each disposed such that its axis is positioned in a plane perpendicular to the carrying direction of the substrate B and is inclined relative to the horizontal direction (see FIGS. 2 and 3). The rollers 51 in the treating apparatus body 3 are all set to have the same angle of inclination, and the tops of the rollers 51 jointly define a substrate pass line 5a thereon along which the substrate B passes. This arrangement enables the substrate B to be subjected to certain treatment while it is carried in an inclined posture through the treating apparatus body 3 along the substrate pass line 5a.

FIGS. 2 and 3 are perspective views, partly cut away, of a first embodiment of the substrate introducing station 2; FIG. 2 shows a state where a substrate transfer section 22 is set to a horizontal posture, and FIG. 3 shows a state where the substrate transfer section 22 is set to an inclined posture, respectively.

As shown in these figures, the substrate introducing station 2 comprises a substrate receiving section 21 for receiving the substrate B from the upstream transfer unit 20 (FIG. 1), and a substrate transfer section (inlet side transfer unit) 22 provided immediately downstream of the substrate receiving section 21. The substrate receiving section 21 is assembled on a base stand 21a which is in turn installed on a floor F. The substrate receiving section 21 comprises a pair of roller support plates 21b extending in the carrying direction of the substrate B and spaced from each other in a width direction (perpendicular to the carrying direction of the substrate B), a plurality of rollers 51 extending horizontally between the pair of roller support plates 21b and supported by roller support shafts 51a to be rotatable about their axes, and a first drive motor 21c for driving all the rollers 51 to rotate in the same direction at a time.

In the substrate receiving section 21, cylindrical rollers (carrying members) 52 are employed as the rollers 51. The cylindrical rollers 52 each comprise a roller body 52a in the cylindrical form defining a central area, and flanges 52b formed at both ends of the roller body 52a. The substrate B is held between the flanges 52b so that it is prevented from shifting laterally on the roller bodies 52a.

Accordingly, by energizing the first drive motor 21c (FIG. 3), where the substrate B has been transferred from the upstream transfer unit 20 (FIG. 1) to the substrate receiving section 21, all of the cylindrical rollers 52 are rotated in the same direction at the same time, causing the substrate B on the roller bodies 52a to be sent the substrate transfer section 22.

The substrate transfer section 22 comprises a roller support member 23 having the U-shape in vertical cross-section, a plurality of cylindrical rollers 52, similar to the above cylindrical rollers, supported by the roller support member 23, a drive unit support frame 24 fixed to one side of the roller support member 23 in the width direction, a roller driving mechanism 25 supported by the drive unit support frame 24, and a transfer section tilting unit 26 disposed between the floor F and the roller support member 23.

The roller support member 23 has a roller support plate 23a formed at one side (right side in FIG. 2) in the width direction, and a joint plate 23b formed at the other side for attachment of the drive unit support frame 24. The drive unit support frame 24 is fixedly attached to the joint plate 23b.

The drive unit support frame 24 includes a roller support plate 24a fixed to the joint plate 23b in close contact relation, a pair of projecting plates 24b projecting outward from both ends of the roller support plate 24a in a longitudinal direction thereof, and a shelf plate 24c fixed to lower edges of both the projecting plates 24b and the roller support plate 24a. The roller driving mechanism 25 is provided in a space surrounded by the roller support plate 24a, the projecting plates 24b and the shelf plate 24c.

Roller support shafts 51a are bridged between the roller support plates 23a, 24a so that the cylindrical rollers 52 are supported by the roller support shafts 51a to be rotatable about their axes between the roller support plates 23a, 24a and are all rotated by the roller driving mechanism 25.

The roller driving mechanism 25 is mounted on the shelf plate 24c of the drive unit support frame 24 and comprises a second drive motor (drive unit) 25a provided with a drive pulley 25b fitted over its drive shaft, a plurality of upper pulleys 25c fitted to respective left ends of the roller support shafts 51a, lower pulleys 25d rotatably supported by a lower portion of the roller support plate 24a in corresponding relation to the upper pulleys 25c, and a timing belt 25e is stretched over the drive pulley 25b, the upper pulleys 25c and the lower pulleys 25d.

By energizing the second drive motor 25a, a driving torque is transmitted to the upper pulleys 25c and the lower pulleys 25d through the drive pulley 25b and the timing belt 25e, whereby the cylindrical rollers 52 are rotated through the roller support shafts 51a to move the substrate B in the carrying direction.

The lower pulleys 25d serve to advance the timing belt 25e in a zigzag motion and increase the distance over which each of the upper pulleys 25c contacts the timing belt 25e. As a result, the timing belt 25e is prevented from slipping off the upper pulleys 25c, the driving torque of the second drive motor 25a is transmitted to the upper pulleys 25c, and all the cylindrical rollers 52 are always stably rotated at the same rotational speed.

The transfer section tilting unit 26 includes a first bracket 26a fixedly provided on the floor F, a cylinder 26c supported at its lower end by a first support shaft 26b of the first bracket 26a to be rotatable about its axis, a piston rod 26d projecting upward from the cylinder 26c, and a second bracket 26f fixed to a lower edge of the roller support plate 23a and having a second support shaft 26g. The piston rod 26d is supported at its upper end by the second support shaft 26g to be rotatable about its axis. With this arrangement, the right side of the roller support member 23 in the width direction is supported above the floor F through the cylinder 26c and the piston rod 26d.

On the other hand, horizontal shafts 27 are projected from the projecting plates 24d in the longitudinal direction and supported rotatably about their own axes by bearings 28 provided at appropriate locations in the substrate receiving station 21 and a chemical cleaning station 31. With this arrangement, the left side of the roller support member 23 is supported by the bearings 28 through the drive unit support frame 24.

Accordingly, by actuating the cylinder 26c to extend the piston rod 26d through a predetermined amount in the condition shown in FIG. 2, the roller support member 23 is turned counterclockwise about the horizontal shafts 27, bringing the substrate transfer section 22 into an inclined posture where it is inclined a predetermined angle in the direction perpendicular to the carrying direction of the substrate B, as shown in FIG. 3. In this embodiment, the inclination angle of the roller support member 23 relative to the horizontal plane is set to the range of 3–7°.

Further, rollers 51 in the treating apparatus body 3 (only the chemical cleaning station 31 in the treating apparatus body 3 being shown in FIGS. 2 and 3) are also set to have an inclination angle in the direction perpendicular to the carrying direction of the substrate B, which is the same as the inclination angle of the roller support member 23. Then, as shown in FIG. 3, in the condition where the roller support member 23 is in an inclined posture, the substrate pass line 5a defined on the plurality of cylindrical rollers 52 of the roller support member 23 is positioned in the same plane as a substrate pass line 5a defined on the plurality of rollers 51 in the treating-apparatus body 3 so that the substrate B is smoothly transferred from the substrate introducing station 2 to the treating apparatus body 3 through a substrate passage opening 31a'.

Incidentally, as shown in FIGS. 2 and 3, the rollers 51 in the treating apparatus body 3 are of so-called partly supporting rollers 52 each constructed such that a central roller 53a is provided centrally of a roller support shaft 51a, a pair of flanges 53b are provided at both ends, and a pair of substrate support rollers 53c are provided inside the pair of flanges 53b in opposed relation.

By employing the partly supporting rollers 52, the area in which the rollers 51 contact the rear surface of the substrate B is reduced, cleaning water and gas can be easily supplied to the rear surface of the substrate B, and contamination of the rear surface of the substrate B due to contact with the rollers 51 during the cleaning process and the drying process can be minimized.

Figure 4:
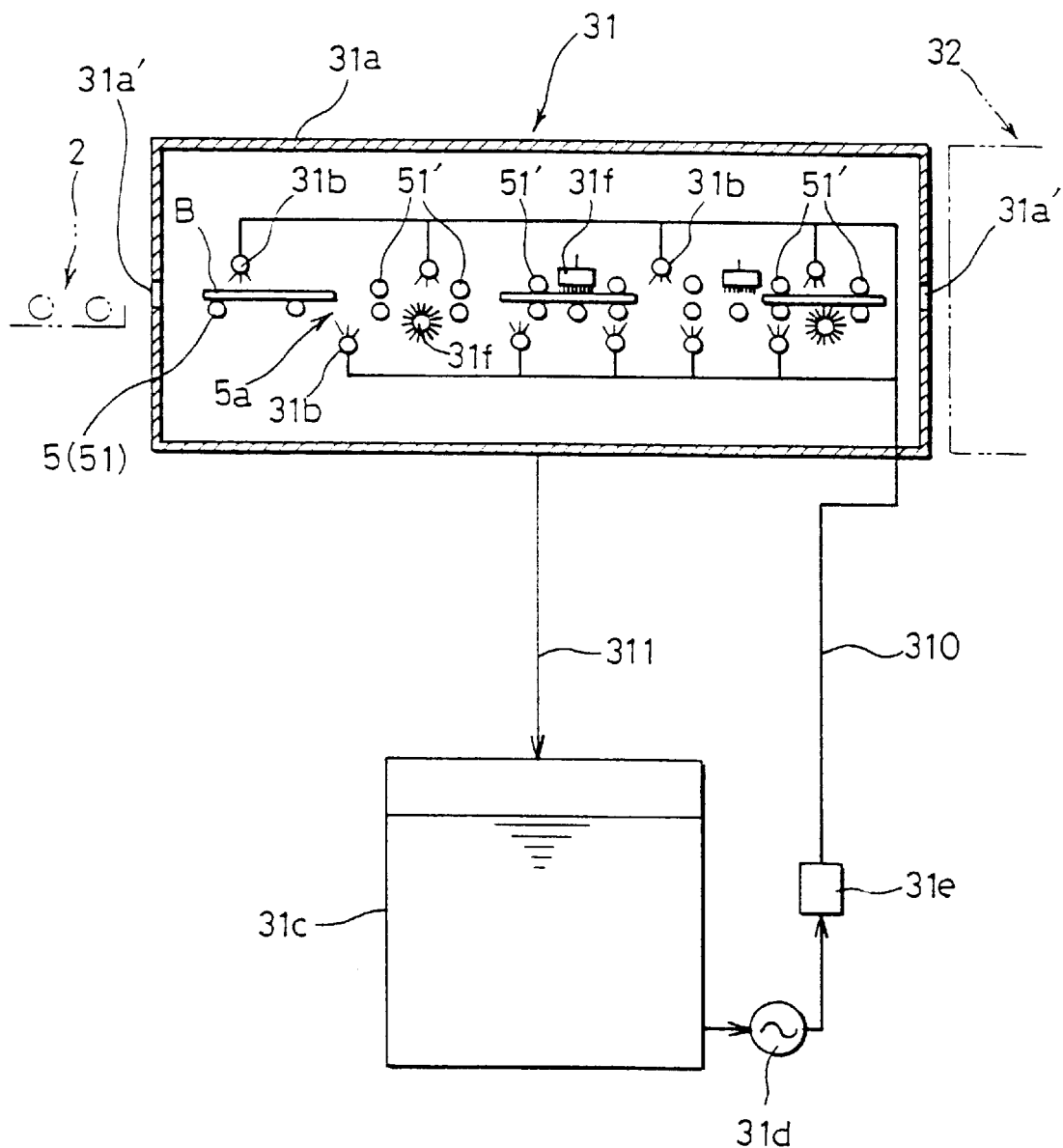
FIG. 4 is an explanatory view showing a first embodiment of a chemical cleaning station.

The treating apparatus body 3 is constructed, in this embodiment, by arranging a chemical cleaning station 31, a water cleaning station 32 and a drying station 37 in series. FIG. 4 is an explanatory view showing one embodiment of the chemical cleaning station 31. As shown in FIG. 4, the chemical cleaning station 31 is to perform cleaning (chemical cleaning) of the substrate B by supplying a given chemical to the front and rear surfaces of the substrate B while it is carried by the carrying unit 5, and includes a chemical cleaning tank 31a in which the carrying unit 5 is laid, a plurality of chemical supply nozzles 31b disposed in the chemical cleaning tank 31a above and below the carrying unit 5 in sandwiching relation, a chemical reservoir 31c for storing the chemical, and a chemical pump 31d for supplying the chemical in the chemical reservoir 31c to the chemical supply nozzles 31b through a chemical supply pipe line 310.

The chemical cleaning tank 31a has substrate passage openings 31a' formed in its upstream and downstream walls for passage of the substrate B therethrough. The substrate B forwarded from the substrate introducing station 2 is introduced into the chemical cleaning tank 31a through the upstream substrate passage opening 31a', and the substrate B having been subjected to chemical cleaning in the chemical cleaning station 31 is delivered toward the water cleaning station 32 through the downstream substrate passage opening 31a'.

The chemical supply nozzles 31b are disposed above and below the substrate pass line 5a in sandwiching relation, and a chemical is ejected from the upper and lower chemical supply nozzles 31b toward the front and rear surfaces of the substrate B. A filter 31e is disposed in the chemical supply pipe line 310 downstream of the chemical pump 31d so that the chemical supplied to the chemical supply nozzles 31b is cleaned by filtering. The chemical which has been ejected from the chemical supply nozzles 31b and employed for chemical cleaning of the substrate B in the chemical cleaning tank 31a are then returned to the chemical reservoir 31c through a return pipe line 311 for repeated use of the chemical through recirculation.

Further, above and below the substrate pass line 5a in the treating apparatus body 3, a plurality of brushes 31f are provided to be rotatable about axes perpendicular to the substrate pass line 5a and axes traversing the substrate pass line 5a in parallel for brushing the front and rear surfaces of the substrate B while it is carried along the substrate pass line 5a. Usable as the brushes 31f are, for example, disk brushes each having bristles planted to the bottom surface of a disk, or rotary brushes each having bristles planted to the circumferential surface of a cylindrical body. By rotating the brushes 31 about the respective axes with bristle tips contacting the front and rear surfaces of the substrate B, the front and rear surfaces of the substrate B are brushed and cleaned while being supplied with the chemical.

Particularly, immediately upstream and downstream of the brushes 31f, retaining rollers 51' are provided above the rollers 51 in opposed relation to hold the substrate B between the retaining rollers 51' and the rollers 51 from above and below. This prevents the substrate B from floating or deviating from the substrate pass line 5a even when subjected to brushing by the brushes 31f.

Thus, the substrate B being carried in the inclined posture along the substrate pass line 5a by the operation of the carrying unit 5 is supplied with the chemical sucked from the chemical reservoir 31c and ejected from the chemical supply nozzles 31b by the operation of the chemical pump 31d, and is subjected to brushing by the brushes 31f under the presence of the chemical. Then, the chemical supplied to the substrate B, i.e., the chemical containing contaminants produced by cleaning the substrate B, flows down over the slopes of the substrate B and is quickly replaced by a fresh clean chemical supplied to the substrate B through the filter 31e. Accordingly, a high cleaning effect can be achieved in a shorter cleaning time. In addition, since the chemical flows down fast over the slopes of the substrate B, the amount of chemical which is brought out with the substrate B is reduced, resulting in less consumption of the chemical, and satisfactory removing of the chemical is also achieved.

As described above, in the present invention, the rollers 51 are inclined in the treating apparatus body 3 so that the substrate B is carried in the inclined posture through the treating apparatus body 3. This is because such an arrangement can provide the following advantages over the case of carrying the substrate B in a horizontal posture.

By carrying the substrate B in the inclined posture, a treating liquid supplied to the substrate B is always allowed to flow down over the substrate slopes. Therefore, when a treating liquid of different kind is supplied to the substrate B in the treating apparatus body 3, the treating liquids of different kinds are prevented from mixing with each other on the substrate B at the boundary between two treating areas because of positive removing of the treating liquid.

Also, since the treating liquid is easily and surely removed out from the substrate B, it is possible to omit liquid removing unit which has been necessarily provided at the boundary between two treating areas in the case of carrying the substrate B in a horizontal posture. This contributes to a reduction in the equipment cost.

Further, the distance between positions at which the treating liquids of different kinds are ejected in two adjacent treating tanks using the respective treating liquids can be shortened. This is effective to prevent the treating liquid from drying up on the substrate B and suppress the occurrence of particles (solid fine particles) and mist due to drying-up of the treating liquid on the substrate B. As a result, contamination of the substrate B caused by the particles and mist adhering to the substrate surfaces again can be surely prevented.

Still further, since the treating liquid, e.g., a chemical, containing contaminants such as particles removed from the substrate B flows down fast over the substrate slopes and is quickly replaced by a fresh clean treating liquid, a very high cleaning effect can be achieved in a shorter cleaning time.

In this embodiment, the inclination angle of the rollers 51 is set in the range of 3°–40°, preferably in the range of 3°–7°. The reason of so setting the inclination angle of the rollers 51 is as follows.

If the inclination angle of the substrate B is less than 3°, the speed of the treating liquid flowing down over the slopes of the substrate B becomes too slow to achieve quick replacement of the treating liquid and a positive removing effect of the liquid.

On the other hand, if the inclination angle of the substrate B is more than 40°, the flow-down speed of the treating liquid becomes so fast and the treating liquid supplied to the substrate B flows down so quickly that the substrate B tends to more easily dry up and a positive treatment effect can not be ensured.

If the inclination angle of the substrate B is in the range of 3°–7°, the treating liquid flows down over the slopes of the substrate B at a proper speed. Therefore, satisfactory replacement of the treating liquid can be achieved, the substrate B can be surely treated, and partial drying-up of the treating liquid on the surfaces of the substrate B can be positively prevented.

When setting the inclination angle of the substrate B, i.e., the inclination angle of the rollers 51, in practical use, the angle is individually determined in consideration of the kind of the treating liquid, the viscosity of the treating liquid, the amount of the treating liquid supplied, the carrying speed of the substrate B, etc. and, if needed, after conducting a test.

Figure 5:
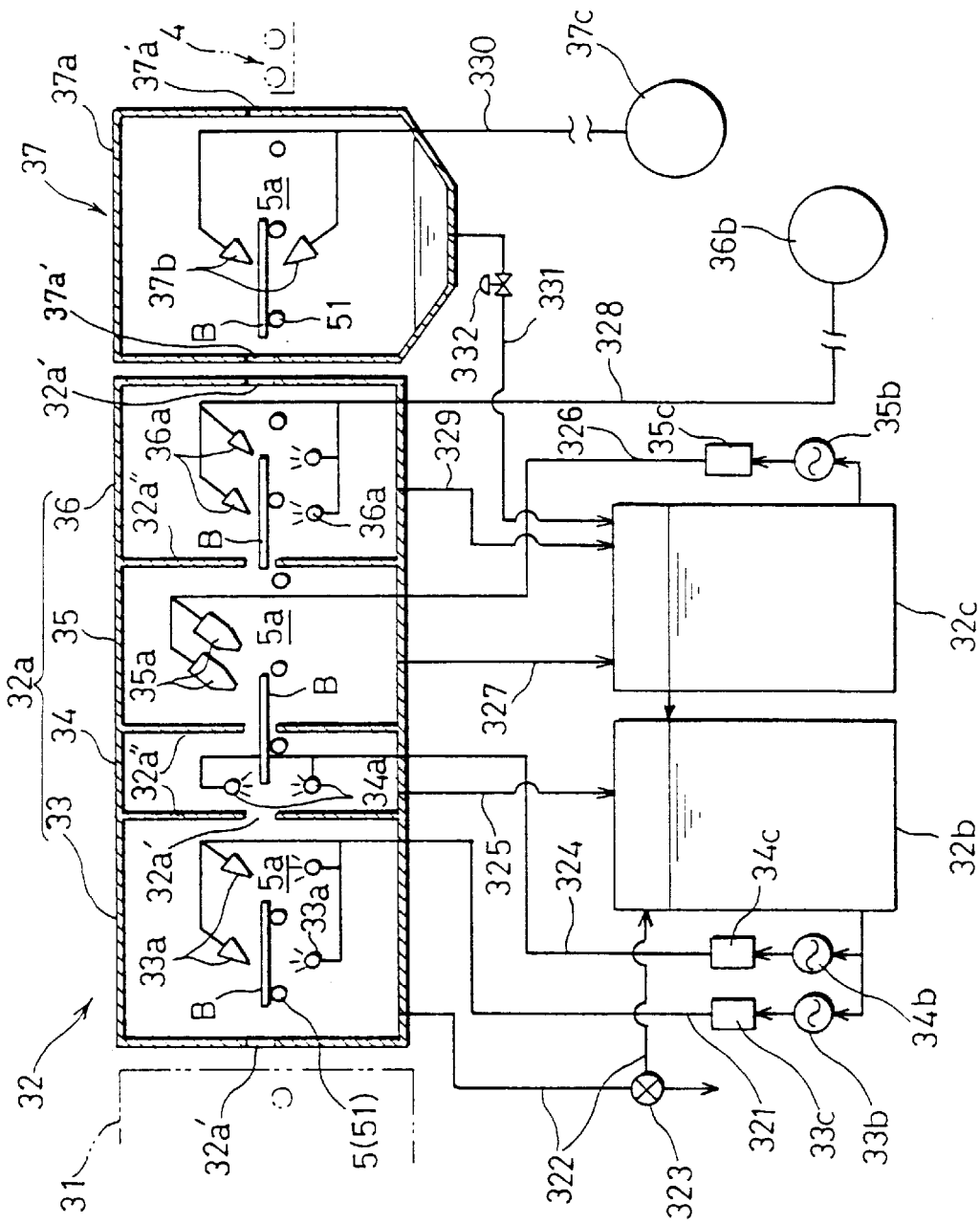
FIG. 5 is an explanatory view showing first embodiment of a water cleaning station and a drying section.

FIG. 5 is an explanatory view showing one embodiment of the water cleaning station 32 and the drying station 37. The water cleaning station 32 will be first described with reference to FIG. 5. The water cleaning station 32 is to perform cleaning (water cleaning) of the substrate B by supplying cleaning water to the substrate B after the chemical cleaning while it is carried by the carrying unit 5, and includes a water cleaning tank 32a in which the carrying unit 5 is laid. The interior of the water cleaning tank 32a is divided by partition walls 32a" into a low-pressure water supply section 33, a high-pressure water supply section 34, a ultrasonic cleaning water supply section 35, and a pure water supply section 36.

Substrate passage openings 32a' are defined in upstream and downstream walls of the water cleaning tank 32a and in the partition walls 32a". The substrate B delivered from the chemical cleaning station 31 is introduced into the water cleaning tank 32a through the upstream substrate passage opening 32a', and then successively passed through the low-pressure water supply section 33, the high-pressure water supply section 34, the ultrasonic cleaning water supply section 35, and the pure water supply section 36. The substrate B having been subjected to a certain water cleaning process is delivered toward the drying station 37 through the downstream substrate passage opening 32a'.

The low-pressure water supply section 33 has low-pressure water supply nozzles 33a disposed above and below the substrate pass line 5a in sandwiching relation, and the high-pressure water supply section 34 has high-pressure water supply nozzles 34a disposed in a similar manner. Also, the ultrasonic cleaning water supply section 35 has ultrasonic water supply nozzles 35a with their ejection ports directed toward the surface of the substrate B passing along the substrate pass line 5a, and the pure water supply section 36 has pure water supply nozzles 36a disposed above and below the substrate pass line 5a in sandwiching relation.

Ones of the low-pressure water supply nozzles 33a which are disposed above the substrate pass line 5a have water ejection ports in the form of elongate slits extending perpendicularly to the carrying direction of the substrate B and parallel to the inclination of the substrate pass line 5a, thereby constituting the so-called water knives. Ones of the low-pressure water supply nozzles 33a which are disposed below the substrate pass line 5a are of conventional cone or sector nozzles having water spray holes in the circular or elliptical form.

Further, a first water reservoir 32b and a second water reservoir 32c are disposed near the water cleaning station 22. Between the first water reservoir 32b and the low-pressure water supply nozzles 33a, there extends a first pipe line 321 in which a low-pressure water pump 33b and a filter 33c are disposed. The cleaning water in the first water reservoir 32b is pumped up through the first pipe line 321 by operation of the low-pressure water pump 33b and, after being cleaned through the filter 33c, supplied to the front and rear surfaces of the substrate B from the low-pressure water supply nozzles 33a. Water cleaning of first stage is thus performed on the substrate B.

Then, the cleaning water ejected from the low-pressure water supply nozzles 33a is returned to the first water reservoir 32b through a return pipe line 322. A selector valve 323 is disposed midway the return pipe line 322 so that, upon switchover of the selector valve 323, the cleaning water flowing down from the low-pressure water supply section 33 can be discharged to the outside of the system.

Also, between the first water reservoir 32b and the high-pressure water supply nozzles 34a, there extends a second pipe line 324 in which a high-pressure water pump 34b and a filter 34c are disposed. The cleaning water in the first water reservoir 32b is pumped up through the second pipe line 324 by operation of the high-pressure water pump 34b and, after being cleaned through the filter 34c, ejected under high pressure toward the front and rear surfaces of the substrate B from the high-pressure water supply nozzles 34a. Water cleaning of second stage is thus performed on the substrate B. Then, the cleaning water ejected from the high-pressure water supply nozzles 34a and employed for cleaning the substrate B is returned to the first water reservoir 32b through a return pipe line 325.

A third pipe line 326 extends between the second water reservoir 32c and the ultrasonic water supply nozzles 35a. A pump 35b and a filter 35c are disposed in the third pipe line 326. The cleaning water in the second water reservoir 32c is pumped up by operation of the pump 35b and, after being cleaned through the filter 35c, supplied to the ultrasonic water supply nozzles 35a.

The ultrasonic water supply nozzles 35a are nozzles with a function of applying ultrasonic vibration to the cleaning water and include built-in ultrasonic oscillators (not shown). The cleaning water supplied to the ultrasonic water supply nozzles 35a is ejected from respective ejection ports while vibration of about 40 kHz is applied to the cleaning water by the ultrasonic oscillators. Water cleaning of third stage is thus performed on the substrate B with the ultrasonic vibration applied to the cleaning water. Then, the cleaning water supplied to the substrate B from the ultrasonic water supply nozzles 35a is returned to the second water reservoir 32c through a return pipe line 327 after cleaning the surface of the substrate B.

The pure water supply section 36 is to perform water cleaning of final (fourth) stage on the substrate B using pure water. Specifically, pure water is supplied from a pure water source 36b to the pure water supply nozzles 36a through a pure water pipe line 328. A finish water cleaning process is performed by supplying pure water to the front and rear surfaces of the substrate B passing along the substrate pass line 5a.

In the pure water supply section 36, the pure water supply nozzles 36a of water knife type are disposed above the substrate pass line 5a to eject pure water therefrom for cleaning the front surface of the substrate B, while the pure water supply nozzles 36a of conventional cone type or the like are disposed below the substrate pass line 5a to clean the rear surface of the substrate B. Then, the cleaning water ejected from the pure water supply nozzles 36a is returned to the second water reservoir 32c through a return pipe line 329 after cleaning the front and rear surfaces of the substrate B.

In the water cleaning station 32 comprising such a series of the low-pressure water supply section 33, the high-pressure water supply section 34, the ultrasonic cleaning water supply section 35, and the pure water supply section 36, the substrate B is carried in the inclined posture by the rollers 51 which are each inclined in a plane perpendicular to the carrying direction of the substrate B, so that the cleaning water supplied to the substrate B in the supply sections 33, 34, 35, 36 is allowed to flow down fast over the slopes of the substrate B. Therefore, the amount of the cleaning water which is brought into the downstream drying station 37 is minimized.

The drying station 37 (FIG. 5) is to dry the substrate B delivered from the pure water supply section 36 of the water cleaning station 32, and includes a drying tank 37a and a pair of air knives 37b disposed above and below the substrate pass line 5a within the drying station 37 in sandwiching relation. Substrate passage openings 37a' are defined in upstream and downstream walls of the drying tank 37a, allowing the substrate B to be carried into and out of the drying tank 37a through the substrate passage openings 37a'. The drying tank 37a has slit-like gas ejection ports disposed perpendicularly to the carrying direction of the substrate B, and gas streams in the form of a belt are sprayed from the gas ejection ports toward the front and rear surfaces of the substrate B for drying it.

The air knives 37b are each connected to a gas source 37c through a gas pipe line 330 so that a high-pressure gas is supplied from the gas source 37c to the air knives 37b. In this embodiment, a high-pressure nitrogen bomb is used as the air source 37c. Connected between the drying tank 37a and the second water reservoir 32c is a return pipe line 331 in which an on/off valve 332 is disposed. By opening the on/off valve 332, the pure water accumulated at the bottom of the drying tank 37a is introduced to the second water reservoir 32c.

In the drying station 37, rollers 51 are also each inclined in a plane perpendicular to the carrying direction of the substrate B relative to the horizontal direction, as with the chemical cleaning tank 31a, so that the cleaning water adhering to the substrate B is removed satisfactorily.

Figure 6:
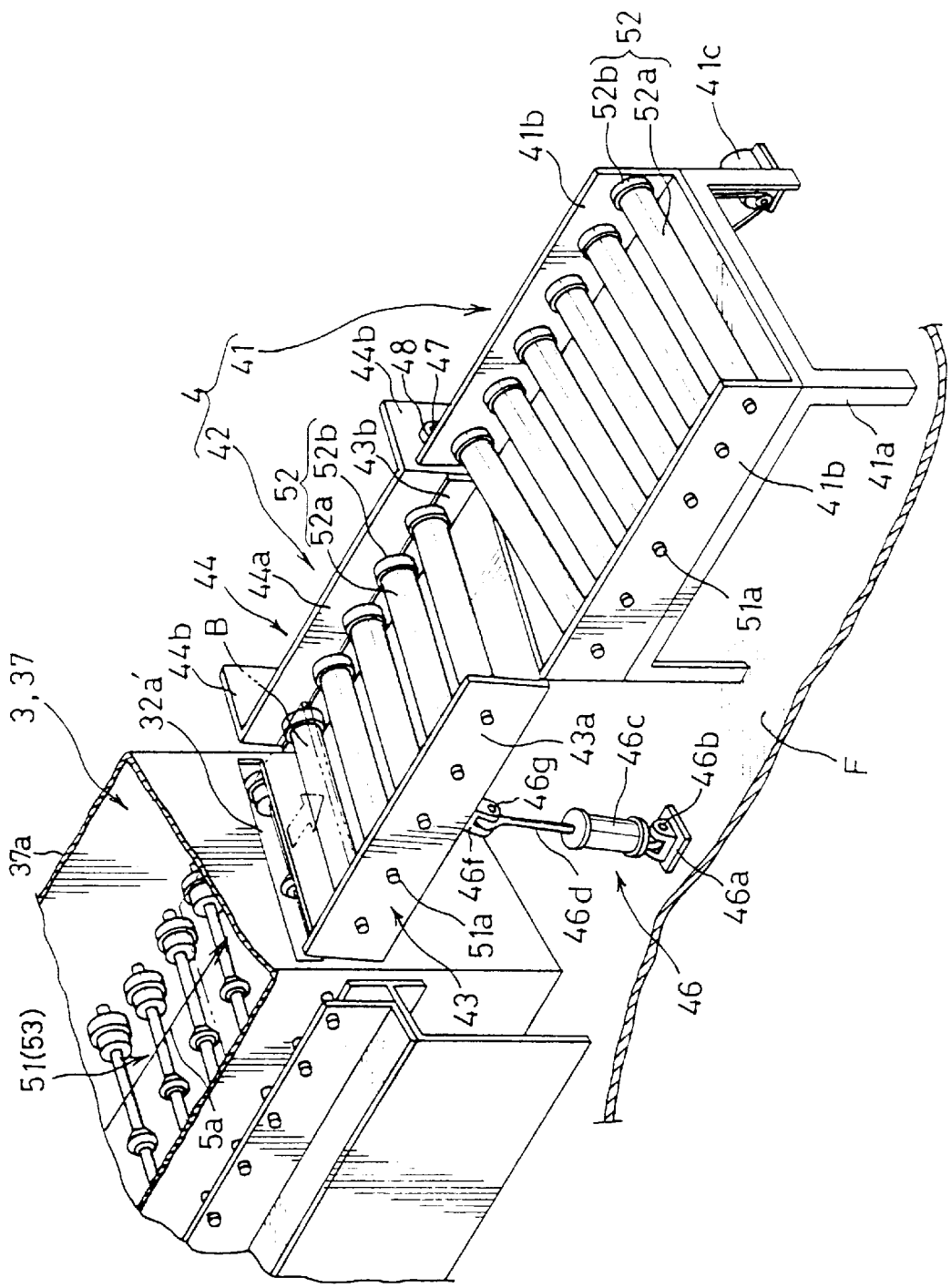
FIG. 6 is a perspective view, partly cut away, of a first embodiment of a substrate delivering station, the view showing a state where a substrate transfer section is set to an inclined posture.
Figure 7:
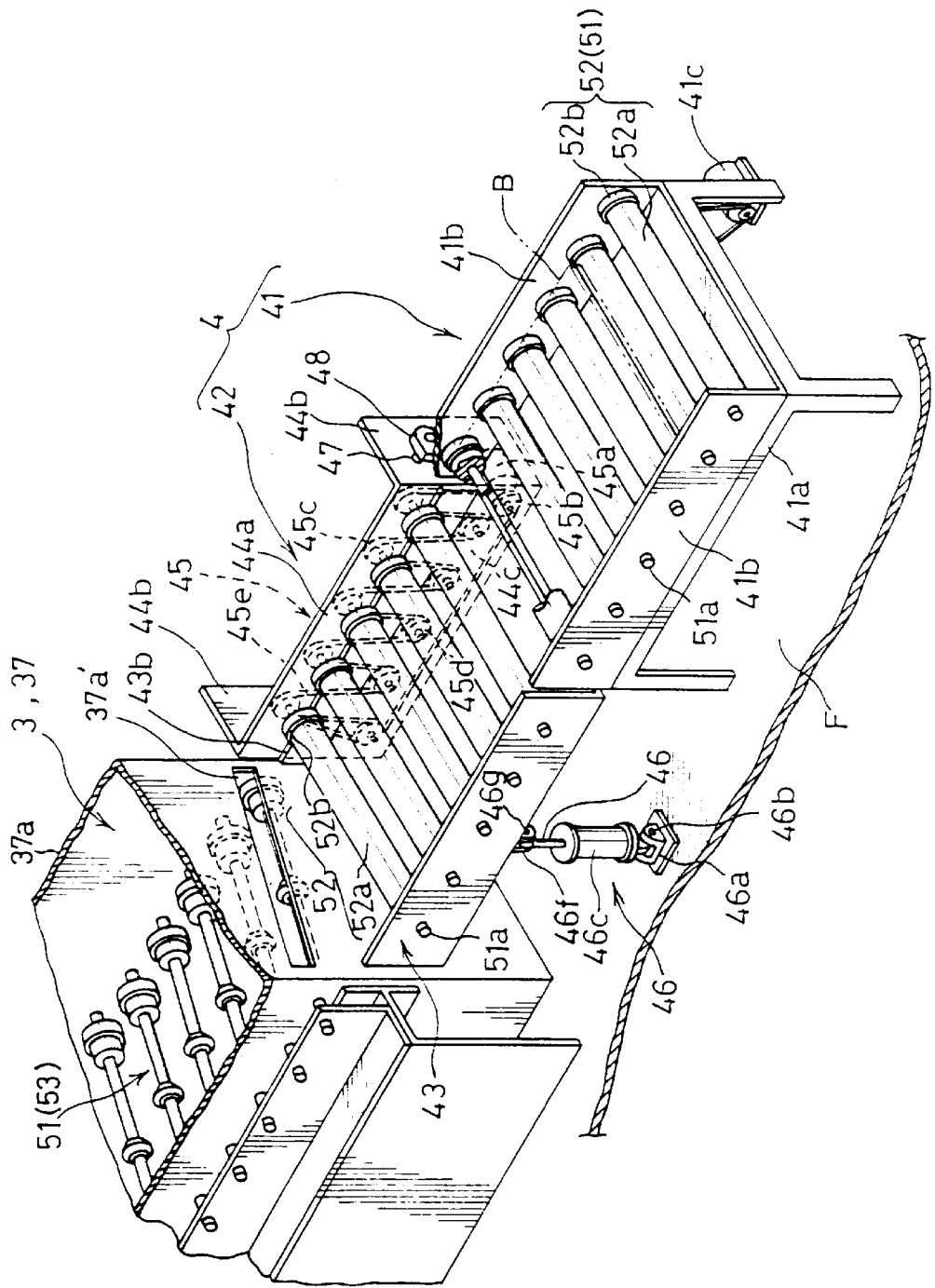
FIG. 7 is a perspective view, partly cut away, of the first embodiment of the substrate delivering station, the view showing a state where the substrate transfer section is set to a horizontal posture.

FIGS. 6 and 7 are perspective views, partly cut away, of a first embodiment of the substrate delivering station 4; FIG. 6 shows a state where a substrate transfer section 42 is set to an inclined posture and FIG. 7 shows a state where the substrate transfer section 42 is set to a horizontal posture. The substrate delivering station 4 has the same structure as the substrate introducing station 2 in symmetric relation with the treating apparatus body 3 therebetween.

As shown FIGS. 6 and 7, the substrate delivering station 4 comprises a substrate transfer section (outlet side transfer unit) 42 for receiving the substrate B from the drying station 37, and a substrate delivering section 41 for delivering the substrate B received by the substrate transfer section 42 to the downstream transfer unit 40 (FIG. 1). The substrate delivering section 41 is assembled on a base stand 41a which is in turn installed on the floor F.

The substrate delivering section 41 comprises a pair of roller support plates 41b extending in the carrying direction of the substrate B and spaced from each other in a width direction (perpendicular to the carrying direction of the substrate B), a plurality of rollers 51 extending horizontally between the pair of roller support plates 41b and supported by roller support shafts 51a to be rotatable about their axes, and a third drive motor 41c for driving all the rollers 51 to rotate in the same direction at a time. In the substrate delivering section 41, cylindrical rollers 52 each comprising a roller body 52a and flanges 52b similarly to those in the substrate receiving section 21 are employed as the rollers 51.

Then, as shown in FIG. 7, by energizing the third drive motor 41c when the substrate B is transferred from the substrate transfer section 42 to the substrate delivering section 41, all the cylindrical rollers 52 are rotated in the same direction at a time, causing the substrate B on the roller bodies 52a to be sent toward the downstream transfer unit 40 (FIG. 1).

The substrate transfer section 42 is located between the drying station 37 and the substrate delivering section 41. The substrate transfer section 42 comprises a roller support member 43 having the U-form in vertical cross-section, a plurality of cylindrical rollers 52, similar to the above cylindrical rollers, supported by the roller support member 43, a drive unit support frame 44 fixed to one side of the roller support member 43 in the width direction, a roller driving mechanism 45 (FIG. 7) supported by the drive unit support frame 44, and a transfer section tilting unit 46 disposed between the floor F and the roller support member 43.

The roller support member 43 has a roller support plate 43a formed at one side (right side in FIG. 6) in the width direction, and a joint plate 43b formed at the other side for attachment of the drive unit support frame 44. The drive unit support frame 44 is fixedly attached to the joint plate 43b.

The drive unit support frame 44 comprises a roller support plate 44a fixed to the joint plate 43b in close contact relation, a pair of projecting plates 44b projecting outward from both ends of the roller support plate 44a in a longitudinal direction thereof, and a shelf plate 44c fixed to lower edges of both the projecting plates 44b and the roller support plate 44a. The roller driving mechanism 45 is provided in a space surrounded by the roller support plate 44a, the projecting plates 44b and the shelf plate 44c.

Roller support shafts 51a are bridged between the roller support plates 43a, 44a so that the cylindrical rollers 52 are supported by the roller support shafts 51a to be rotatable about their respective axes between the roller support plates 43a, 44a and are all rotated by the roller driving mechanism 45 at a time.

As shown in FIG. 7, the roller driving mechanism 45 is mounted on the shelf plate 44c of the drive unit support frame 44 and comprises a fourth drive motor 45a provided with a drive pulley 45b fitted over its drive shaft, a plurality of upper pulleys 45c fitted to respective left ends of the roller support shafts 51a, lower pulleys 45d rotatably supported by a lower portion of the roller support plate 44a in corresponding relation to the upper pulleys 45c, and a timing belt 45e stretched to run over the drive pulley 45b, the upper pulleys 45c and the lower pulleys 45d.

Accordingly, by energizing the fourth drive motor 45a, the driving torque is transmitted to the upper pulleys 45c and the lower pulleys 45d through the drive pulley 45b and the timing belt 45e, whereupon the cylindrical rollers 52 are rotated through the roller support shafts 51a to move the substrate B in the carrying direction.

The transfer section tilting unit 46 comprises a third bracket 46a fixedly provided on the floor F, a cylinder 46c supported at its lower end by a third support shaft 46b of the third bracket 46a to be rotatable about its axis, a piston rod 46d projecting upward from the cylinder 46c, and a fourth bracket 46f fixed to a lower edge of the roller support plate 43a and having a fourth support shaft 46g. The piston rod 46d is supported at its upper end by the fourth support shaft 46g to be rotatable about its axis. With this arrangement, the right side of the roller support member 43 in the width direction is supported above the floor F through the cylinder 46c and the piston rod 46d.

On the other hand, horizontal shafts 47 are projected from the projecting plates 44b in the longitudinal direction and supported rotatably about their own axes by bearings 48 provided at appropriate locations in the substrate delivering station 41 and the drying station 37. With this arrangement, the left side of the roller support member 43 is supported by the bearings 48 through the drive unit support frame 44.

Accordingly, by actuating the cylinder 46c to extend the piston rod 46d through a predetermined amount in the condition shown in FIG. 6, the roller support member 43 in an inclined posture is turned counterclockwise about the horizontal shafts 47, bringing the substrate transfer section 42 in to a horizontal posture, as shown in FIG. 7.

The operation of the present invention will be described below. As shown in FIG. 1, the substrates B are transferred from the upstream transfer unit 20 to the substrate introducing station 2 one by one, and then introduced by operation of the carrying unit 5 in to the treating apparatus body 3 where each substrate is subjected to certain treatment through successive steps. After that, the substrate B is transferred to the downstream transfer unit 40 through the substrate delivering station 4.

As shown in FIG. 2, the substrate B forwarded from the upstream transfer unit 20 is first placed on the cylindrical rollers 52 of the substrate receiving section 21 in the substrate introducing station 2, and then carried onto the substrate transfer section 22 in a horizontal posture with the rotation of the cylindrical rollers 52 driven by the first drive motor 21c. At this time, the second drive motor 25a is energized to rotate the cylindrical rollers 52 of the substrate transfer section 22 for receiving the substrate B sent from the substrate receiving section 21.

Then, at the time the substrate B is completely moved into the substrate transfer section 22, the energization of the second drive motor 25a is stopped and the transfer section tilting unit 26 is instead actuated to project the piston rod 26d from the cylinder 26c, thereby tilting the roller support member 23 about the horizontal shafts 27. Accordingly, as shown in FIG. 3, the substrate transfer section 22 is brought into an inclined posture.

In this condition, the substrate pass line 5a on the rollers 51 of the substrate transfer section 22 is flush with the downstream substrate pass line 5a in the treating apparatus body 3. At this time, the second drive motor 25a is energized again, causing the substrate B on the substrate transfer section 22 to be introduced into the chemical cleaning tank 31a through the substrate passage opening 31a'. Then, the substrate B is carried through the treating apparatus body 3 by the rollers 51 which are always rotated in the treating apparatus body 3, and the aforementioned preset treatment processes are performed on the substrate B in the chemical cleaning station 31, the water cleaning station 32, the low-pressure water supply section 33, the high-pressure water supply section 34, the ultrasonic cleaning water supply section 35, the pure water supply section 36, and the drying section 37.

After the substrate B has been delivered, the substrate transfer section 22 is returned to the original horizontal posture by actuating the cylinder 26c in a reversed manner so as to successively repeat the steps of receiving the next substrate B from the substrate receiving section 21, tilting from the horizontal posture to the inclined posture again, and sending it to the treating apparatus body 3. Therefore, the substrates B are introduced one by one into the treating apparatus body 3 with predetermined intervals therebetween.

In the treating apparatus body 3, since the substrate pass line 5a defined on the rollers 51 is inclined in the width direction, the substrate B is carried through the treating apparatus body 3 while maintaining an inclined posture. As a result, a chemical and cleaning water supplied to the front and rear surfaces of the substrate B are allowed to flow down over the slopes of the substrate B and are highly satisfactorily wiped from the substrate B. It is thus possible to achieve a very high cleaning effect in a shorter cleaning time, and to reduce the amount of chemical brought out with the substrate and hence consumed. Further, treating liquids of different kinds are surely prevented from mixing with each other on the front and rear surfaces of the substrate B at the boundaries between the chemical cleaning tank 31a and the water cleaning tank 32a and between the water cleaning tank 32a and the drying tank 37a.

Then, as shown in FIG. 6, the substrate B on the substrate pass line 5a which has been completely dried in the drying station 37 is delivered toward the substrate delivering station 4 through the substrate passage opening 37a' and carried onto the cylindrical rollers 52 of the substrate transfer section 42 in an inclined posture. After that, at the time the substrate B is completely delivered out of the drying tank 37a, the energization of the fourth drive motor 45a is stopped and the transfer section tilting unit 46 is instead actuated to lower the piston rod 46d, causing the roller support member 43 of the substrate transfer section 42 to take a horizontal posture as shown in FIG. 7.

In this condition, the fourth drive motor 45a is energized again to move the substrate B onto the rotating cylindrical rollers 52 of the substrate transfer section 41 driven by the third drive motor 41c and then to the downstream transfer unit 40. The foregoing operation of the substrate delivering station 4 is repeated whenever the substrate B is delivered out of the drying tank 37a.

Figure 8:
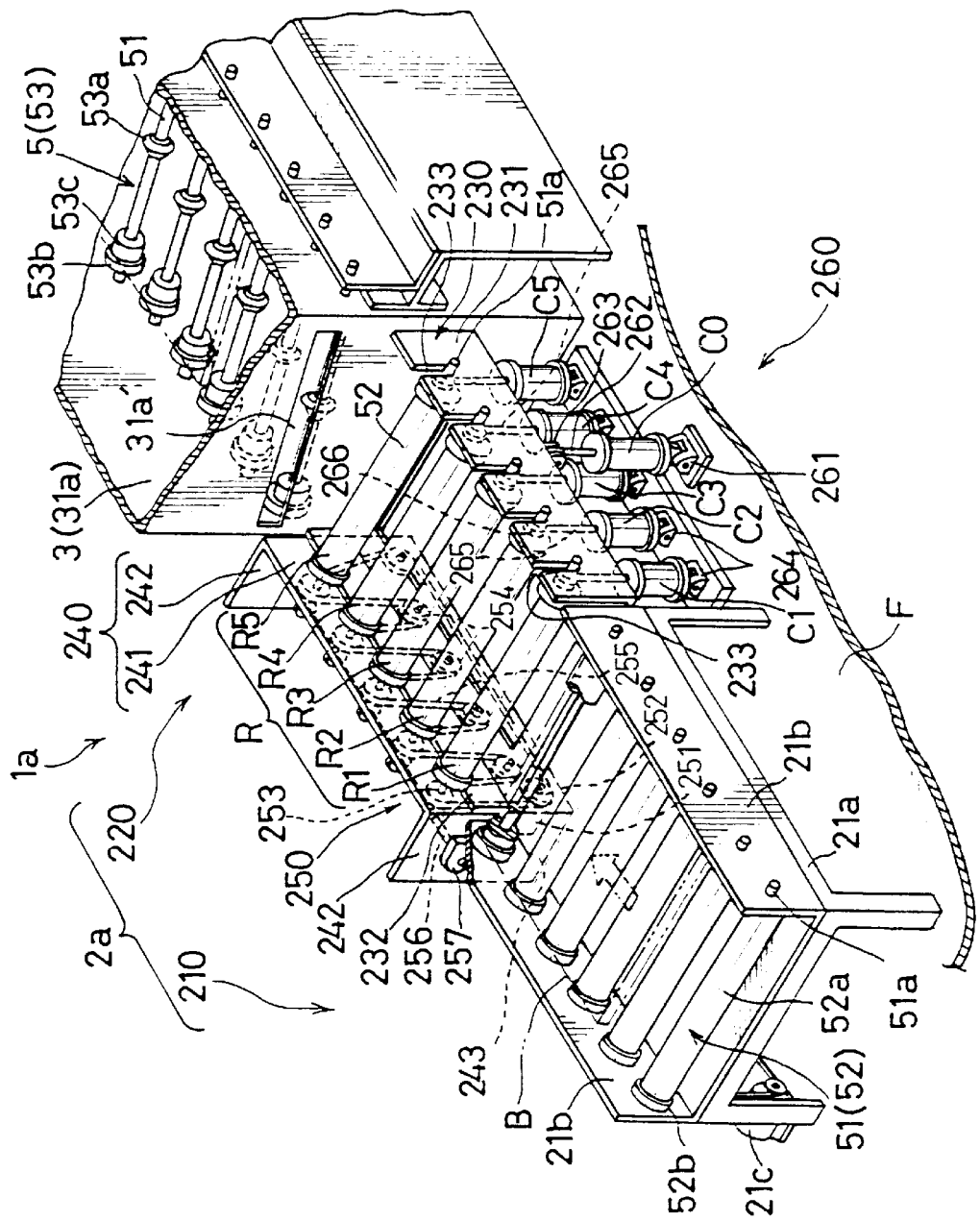
Figure 9:
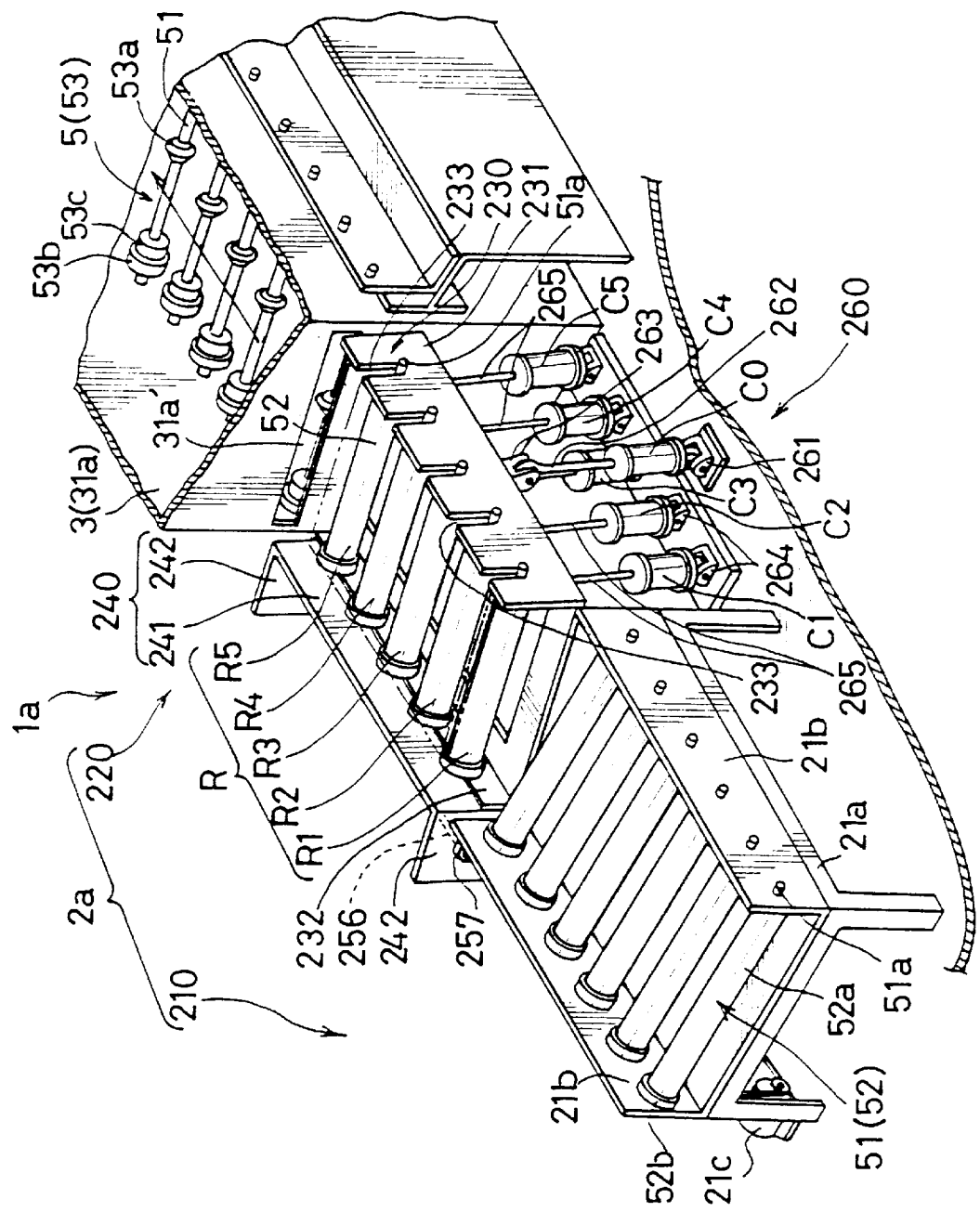
Figure 10:
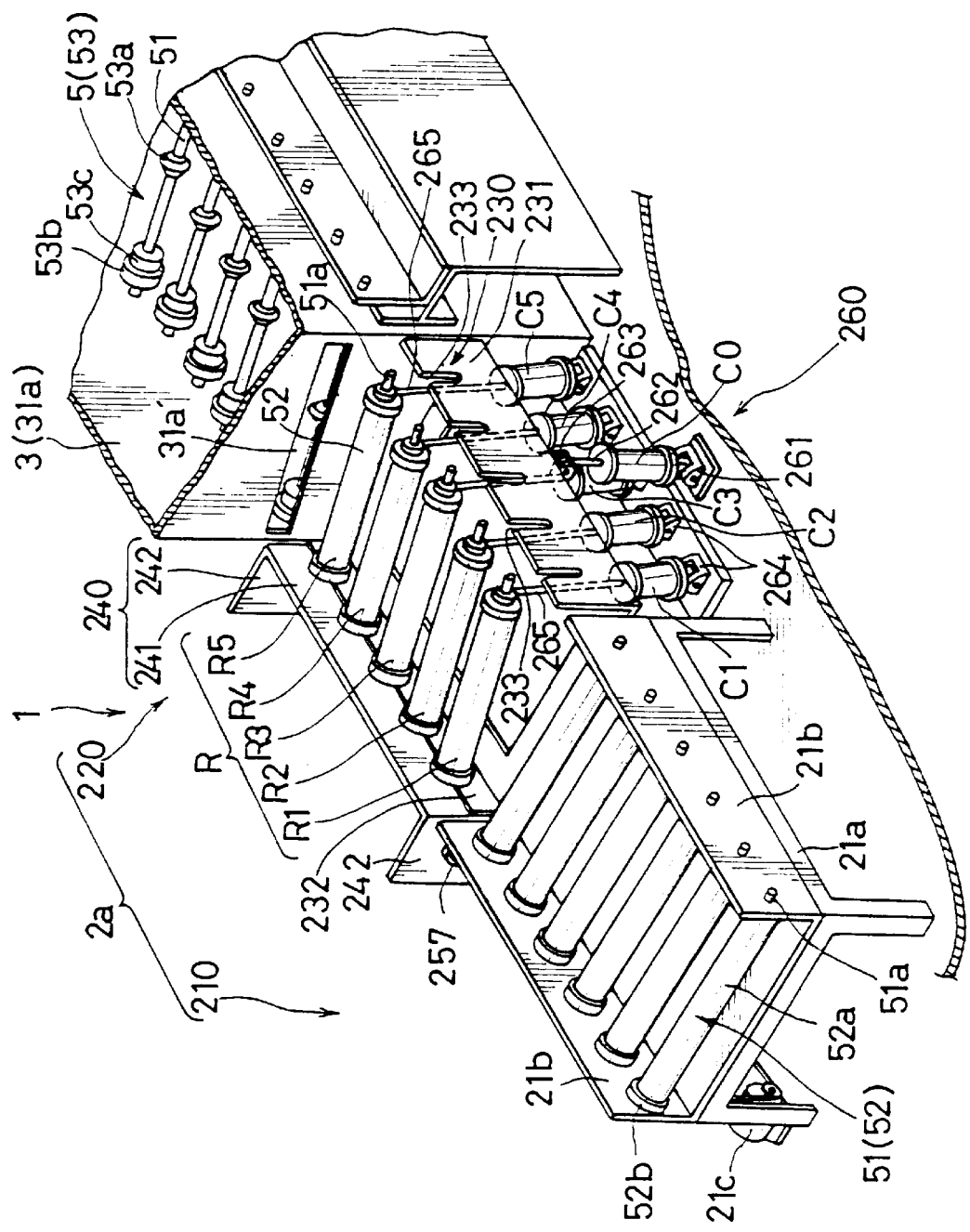
Figure 11:
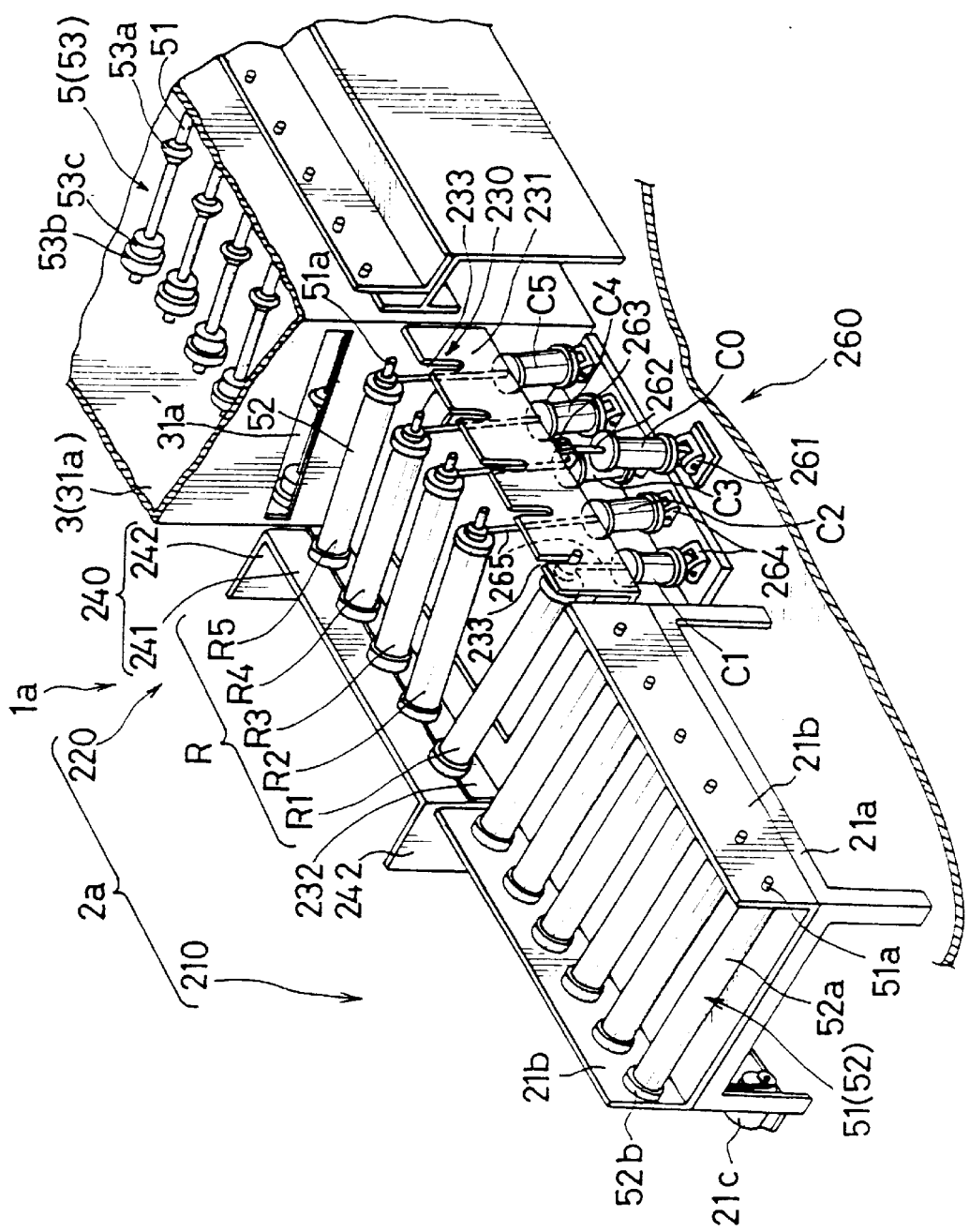

Next, a substrate treating apparatus 1a of a second embodiment will be described. The substrate treating apparatus 1a of this second embodiment differs from the first embodiment in a substrate introducing station 2a and a substrate delivering station, but has a treating apparatus body 3 similarly constructed as with the first embodiment. Note that the substrate delivering station is of the same structure as the substrate introducing station 2a from the mechanical point of view and hence will not be described below. FIGS. 8 to 11 are perspective views, partly cut away, showing the substrate introducing section 2a of the second embodiment; FIG. 8 shows a state where the carrying surface of a substrate transfer section is set to a horizontal posture, FIG. 9 shows a state where the carrying surface of the substrate transfer section is set to an inclined posture by raising a piston rod of a main cylinder only, FIG. 10 shows a state where the carrying surface of the substrate transfer section is set to an inclined posture by raising piston rods of all sub-cylinders, and FIG. 11 shows a state where the piston rod of a first sub-cylinder only is lowered in the state shown in FIG. 10.

As shown in FIGS. 8 to 11, a substrate receiving section 210 is assembled on a base stand 21a which is in turn installed on a floor F. The substrate receiving section 210 comprises a pair of roller support plates 21b spaced from each other in a width direction perpendicular to the carrying direction of the substrate B, a plurality of rollers 51 extending horizontally between the pair of roller support plates 21b and supported by roller support shafts 51a to be rotatable therewith about their axes, and a first drive motor 21c for driving all the roller support shafts 51a to rotate in synchronous relation.

In the substrate receiving section 210, cylindrical rollers 52 are employed as the rollers 51. The cylindrical rollers 52 each comprises a roller body 52a in the cylindrical form defining a central area, and flanges 52b formed at both ends of the roller body 52a. A substrate B is held between the flanges 52b so that it is prevented from shifting laterally on the roller bodies 52a.

Accordingly, by energizing the first drive motor 21c in a condition where the substrate B has been transferred from an upstream transfer unit 20 (FIG. 1) to the substrate receiving section 210, all the cylindrical rollers 52 are rotated in synchronous relation, causing the substrate B on the roller bodies 52a to be sent toward a substrate transfer section 220.

The substrate transfer section 220 comprises a movable roller mount 230 having the U-shape in vertical cross-section, a roller group R consisting of plural unit rollers (unit transfer unit) R1–R5 supported by the movable roller mount 230, a support frame 240 fixed to one side of the movable roller mount 230 in the width direction, a roller driving mechanism 250 supported by the support frame 240, and a roller tilting unit 260 disposed between the floor F and the movable roller mount 230.

A first unit roller R1, a second unit roller R2, a third unit roller R3, a fourth unit roller R4 and a fifth unit roller R5 disposed in the order named from the upstream side (left side in FIG. 1) and making up the roller group R are each of basically the same structure as the aforesaid cylindrical roller 52.

The movable roller mount 230 has a roller support plate 231 formed at one side (right side in FIG. 8) in the width direction, and a joint plate 232 formed at the other side for attachment of the support frame 240. The support frame 240 is fixedly attached to the joint plate 232. The roller support plate 231 has bearing slots (or U-shaped slots) 233 cut in its upper edge to extend downward to support the roller support shafts 51a of the unit rollers R1–R5 at right ends thereof.

The support frame 240 comprises a side plate 241 fixed to the joint plate 232 and a pair of projecting plates 242 formed by bending both longitudinal ends of the side plate 241 at a right angle and hence spaced in a longitudinal direction thereof. The unit rollers R1–R5 have respective roller support shafts 51a and are mounted on the movable roller mount 230 such that the roller support shafts 51a are supported at their free ends (right ends as viewed in the carrying direction of the substrate in FIGS. 8 to 11) in the respective bearing slots 233. The roller driving mechanism 250 in the substrate transfer section 220 is provided on a base frame (not shown) in a space surrounded by the side plate 241 and the projecting plates 242.

The roller driving mechanism 250 is made up of a second drive motor (drive means) 251 (FIG. 8) provided with a drive pulley 252 (FIG. 8) fitted over its drive shaft, a plurality of roller pulleys 253 fitted to respective left ends of the roller support shafts 51a, auxiliary pulleys 254 rotatably supported by a lower portion of the side plate 241 in corresponding relation to the roller pulleys 253, and a timing belt 255 (FIG. 8) stretched to run over the drive pulley 252, the roller pulleys 253 and the auxiliary pulleys 254.

Accordingly, by energizing the second drive motor 251, the driving torque is transmitted to the roller pulleys 253 and the auxiliary pulleys 254 through the drive pulley 252 and the timing belt 255, whereupon the unit rollers R1–R5 are rotated in synchronous relation through the roller support shafts 51a to move the substrate B in the carrying direction.

The auxiliary pulleys 254 serve to advance the timing belt 255 in zigzag motion and increase the distance over which each of the roller pulleys 253 contacts the timing belt 255. As a result, the timing belt 255 is effectively prevented from slipping off the roller pulleys 255.

Figure 12:
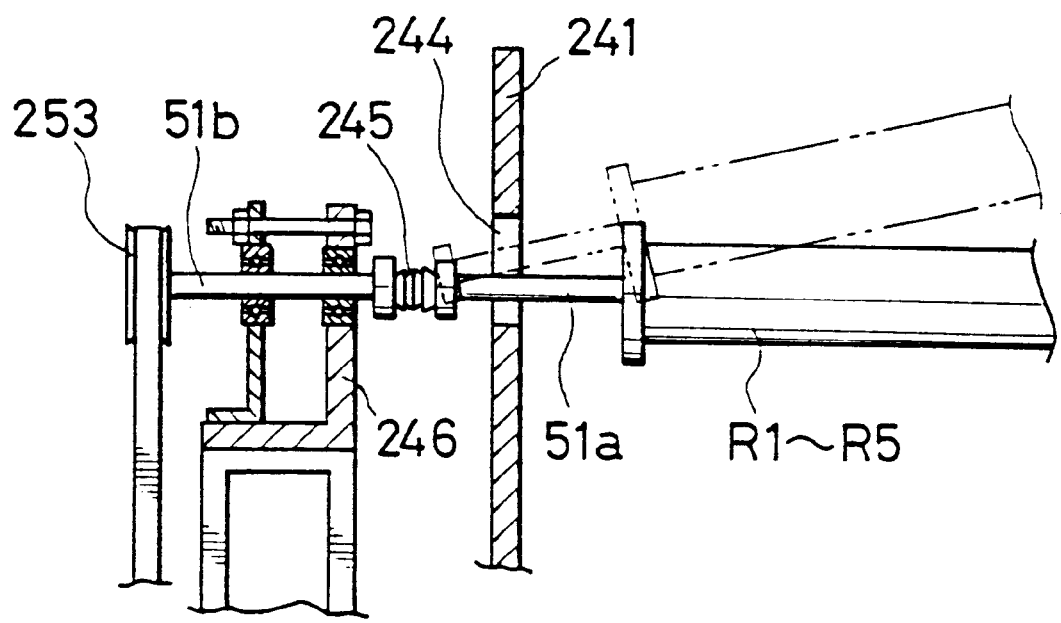
FIG. 12 is a sectional view showing one embodiment of the structure for supporting the base end of a roller support shaft for each unit roller.

FIG. 12 is a sectional view showing one embodiment of the structure for supporting the base end of the roller support shaft 51a for each of the unit rollers R1–R5. As shown in FIG. 12, the base end of the roller support shaft 51a penetrates an elongate hole 244 which is formed in the side plate 241 to extend vertically, and then projects outwardly of the side plate 241, with its tip end connected to a power transmitting shaft 51b through a flexible coupling 245 such as a universal joint. The power transmitting shaft 51b is supported by a bearing member 246 including a built-in ball bearing or the like. The roller pulley 253 is attached to the tip end of the power transmitting shaft 51b thus supported by the bearing member 246.

Accordingly, when any one of the unit rollers R1–R5 is inclined in a state (FIG. 8) where the movable roller mount 230 is set to a horizontal posture (the side plate 241 is in a vertical posture), for example, the roller support shaft 51a is bent upward at the flexible coupling 245 with respect to the power transmitting shaft 51b as indicated by two-dot-chain lines in FIG. 12. However, the rotation of the power transmitting shaft 51b is smoothly transmitted to the roller support shaft 51a through an action of the flexible coupling 245. Likewise, when any one of the unit rollers R1–R5 is returned to a horizontal posture in a state where the movable roller mount 230 is set to the inclined posture, the rotation of the power transmitting shaft 51b is smoothly transmitted to the roller support shaft 51a.

Further, when the unit rollers R1–R5 are all changed in posture at a time upon the movable roller mount 230 changing its posture, the unit rollers R1–R5 are also turned about the flexible couplings 245.

The roller tilting unit 260 is provided to tilt the movable roller mount 230 so that the roller group R is inclined to change the posture of the substrate B. The roller tilting unit 260 is vertically provided on the floor F below the movable roller mount 230 on the right side, and comprises a main cylinder (posture changing means) C0 (corresponding to the cylinder 26c in the first embodiment) for tilting the movable roller mount 230 and a sub-cylinder group C vertically provided on the floor F inside the main cylinder C0 corresponding to respective right ends of the unit rollers R1–R5.

The main cylinder C0 is supported at its lower end by a horizontal shaft of a lower bracket 261, which is fixedly provided on the floor F, to be rotatable about its axis, the horizontal shaft extending in the carrying direction of the substrate. A piston rod 262 projecting upward from the main cylinder C0 is supported at its upper end by a horizontal shaft of an upper bracket 263, which is fixed to the bottom of the movable roller mount 230, to be rotatable about its axis, the horizontal shaft extending in the carrying direction of the substrate.

The sub-cylinder group C includes five cylinders (posture restoring means), i.e., a first sub-cylinder C1, a second sub-cylinder C2, a third sub-cylinder C3, a fourth sub-cylinder C4 and a fifth sub-cylinder C5, which are successively disposed in the order named from the upstream side corresponding to the unit rollers R1–R5. These unit cylinders (posture restoring means) C1–C5 are each supported at its lower end by a horizontal shaft of a lower bracket 264, which is fixedly provided on the floor F, to be rotatable about its axis, the horizontal shaft extending in the carrying direction of the substrate. A bearing 266 (FIG. 8) is provided at the upper end of a piston rod 265 projecting upward from the unit cylinder, the roller support shaft 51a of each of the unit rollers R1–R5 is supported by the bearing 266.

On the other hand, a horizontal shaft 256 extending in the carrying direction of the substrate is bridged between the projecting plates 242. The horizontal shaft 256 is supported rotatably about its own axis by bearings 257 provided at appropriate locations in the substrate receiving section 210 and the treating apparatus body 3. With this arrangement, the left side of the movable roller mount 230 is supported by the bearings 257 through the support frame 240.

The substrate transfer section 220 thus constructed operates as follows. In the state shown in FIG. 8, by switching over supply lines (not shown) of gas pressure in a certain way to make the piston rods 265 of the first to fifth sub-cylinders C1–C5 free in operation and actuating the main cylinder C0 to project the piston rod 262 in a predetermined amount, the movable roller mount 230 is turned about the horizontal shaft 256 to come into an inclined posture in which the movable roller mount 230 is inclined a predetermined able in a direction perpendicular to the carrying direction of the substrate B, as shown in FIG. 9. At the same time, the piston rods 265 of the sub-cylinders C1–C5 being free and fitted in the respective bearing slots 233 of the movable roller mount 230 are projected from the sub-cylinders C1–C5, causing the roller group R to take a posture corresponding to the inclined posture.

In this condition, the piston rods 265 of the sub-cylinders C1–C5 are changed from the free state to a state of holding their projected positions, enabling the projected state of the piston rod 262 to be held. In this embodiment, the inclination angle of the unit rollers R1–R5 relative to a horizontal plane is set in the range of 3°–7°.

Then, in the state of the roller group R taking the inclination posture as shown in FIG. 9, by actuating the main cylinder C0 to lower the piston rod 262, the movable roller mount 230 is turned about the horizontal shaft 256 to come into a horizontal posture, while the sub-cylinders C1–C5 are maintained in the inclined posture with their piston rods 265 in the projected positions, as shown in FIG. 10.

In this condition of FIG. 10 where the movable roller mount 230 is set to the horizontal posture and the sub-cylinders C1–C5 are set to the inclined posture, any of the unit rollers R1–R5 supported by the piston rods 26 can be lowered independently of the remaining unit rollers. Accordingly, by actuating the first sub-cylinder C1 to lower its piston rod 265 alone, for example, only the first unit roller R1 is brought into a horizontal posture, but the second to fifth unit rollers R2–R5 are maintained in an inclined posture.

In this embodiment, the substrate transfer section 220 receives the substrate B from the substrate introducing station 210 in a condition where the roller group R on the movable roller mount 230 is set to the horizontal posture as shown in FIG. 8. At the time the downstream end of the substrate B comes to the fifth unit roller R5, the main cylinder C0 is actuated to set the sub-cylinder group C into the inclined posture (FIG. 9). Then, the main cylinder C0 is actuated reversely to return the movable roller mount 230 only to the horizontal posture, resulting in a state where the unit rollers R1–R5 are maintained in the inclined state by only the piston rods 265 of the sub-cylinders C1–C5 (FIG. 10).

Subsequently, at the time the upstream end of the substrate B moves forward away from the first unit roller R1, the first sub-cylinder C1 is actuated reversely, whereupon the piston rod 265 of the first sub-cylinder C1 is lowered to return the first unit roller R1 to the horizontal posture (FIG. 11). After that, whenever the upstream end of the substrate B passes each of the second to fifth unit rollers R2–R5, these unit rollers are returned one by one to the horizontal posture while the substrate B is forwarded to the treating apparatus body 3 as a next step.

Then, a plurality of substrates B are carried in synchronous relation such that at the time the first one R1 of the unit rollers R1–R5 set to the inclined posture is returned to the horizontal posture, the succeeding substrate B is introduced from the substrate receiving section 210 to the substrate transfer section 220. This timed relationship enables the succeeding substrate B to be carried by the first to fifth unit rollers R1–R5 which are successively returned to the horizontal posture, and brought into a set condition on the roller group R which is in the horizontal posture. Subsequently, the operation of the main cylinder C0 and the sub-cylinders C1–C5 is repeated in the same manner as described above, whereby the succeeding substrate B is forwarded to the treating apparatus body 3.

On the other hand, the treating apparatus body 3 has an elongate substrate passage opening 31a' formed in its upstream wall to extend in a width direction corresponding to the inclined posture of the substrate B, and also has rollers 51 disposed therein. The inclination angle of the rollers 51 in a direction perpendicular to the carrying direction of the substrate is also set as with the movable roller mount 230. As shown in FIGS. 9 to 11, therefore, the inclined carrying surface defined on the roller group R and the inclined carrying surface defined on the plurality of roller 51 in the treating apparatus body 3 are flush with each other so that the substrate B is smoothly transferred from the substrate transfer section 220 to the treating apparatus body 3 through the substrate passage opening 31a'.

Figure 13:
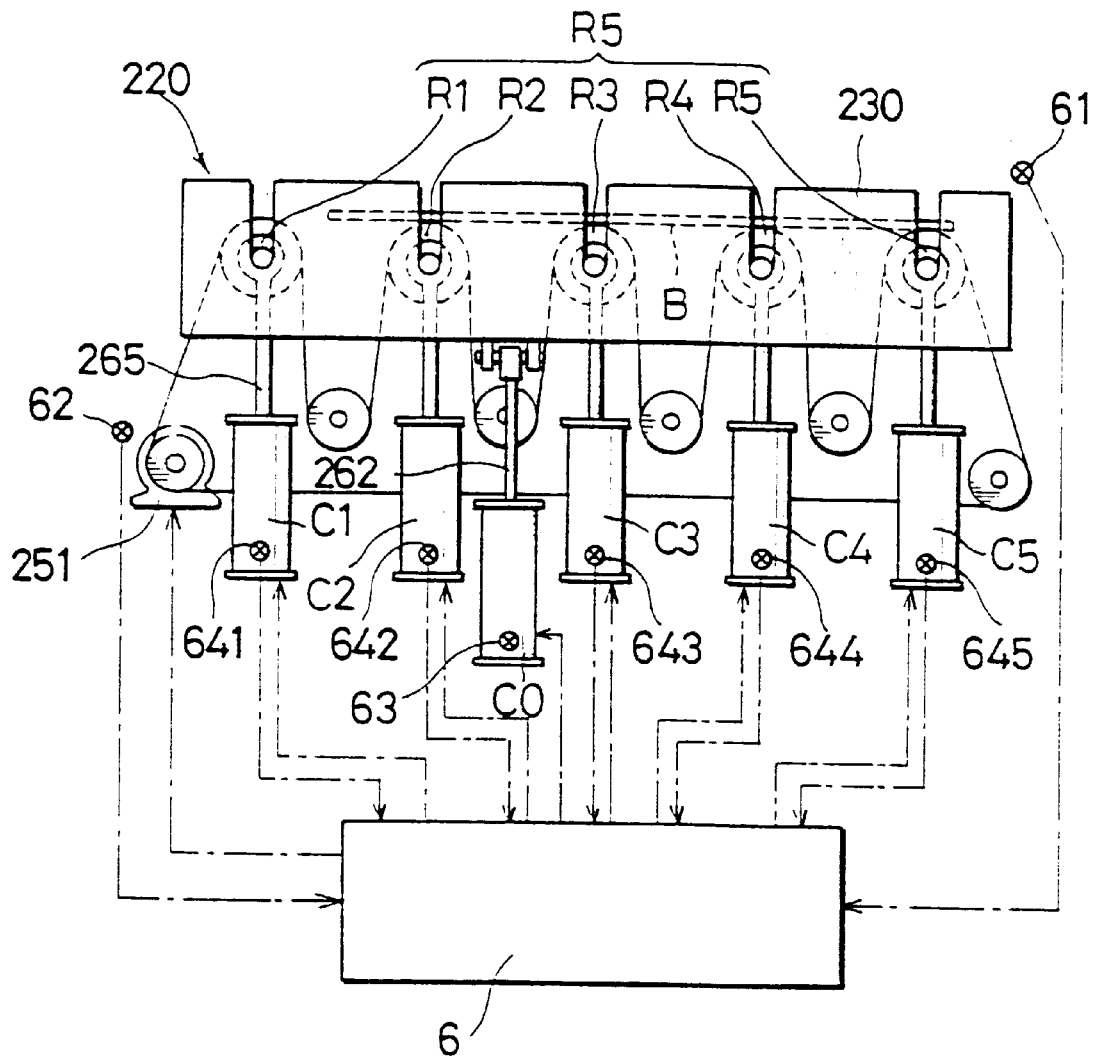
FIG. 13 is a block diagram showing one embodiment of a control system for the substrate transfer section.

FIG. 13 is a block diagram showing one embodiment of a control system for the substrate transfer section 220. As shown in FIG. 13, the transfer operation of the substrate B over the substrate transfer section 220 is controlled with controls signals issued from a control unit 5 based on detection signals sent from respective sensors disposed in various locations.

A substrate sensor (detecting means) 61 for detecting that the substrate B is introduced onto the sub-cylinder group C in the horizontal posture, is disposed in an appropriate location at the downstream end of the substrate transfer section 220. The second drive motor 251 is provided with a revolution number speed sensor 62 for detecting the revolution number thereof. Further, the main cylinder C0 is provided with a rod position sensor 63 for detecting whether the piston rod 262 is raised or lowered, and the first to fifth sub-cylinders C1–C5 are provided with first to fifth rod position sensors 641–645 for detecting whether their piston rods 265 are raised or lowered. These first to fifth rod position sensors 641–645 make it possible to detect whether the piston rods 265 of the sub-cylinders C1–C5 are each in an upper or lower end position.

The results detected by the substrate sensor 61, the revolution number sensor 62, the rod position sensor 63 and the first to fifth rod position sensors 641–645 are input to the control unit 5 in sequence. Then, certain control signals based on the values of the detection signals are output from the control unit 5 to the second drive motor 251, the main cylinder C0 and the sub-cylinders C1–C5 for controlling the transfer operation of the substrate B in the substrate transfer section 220.

Figure 14:
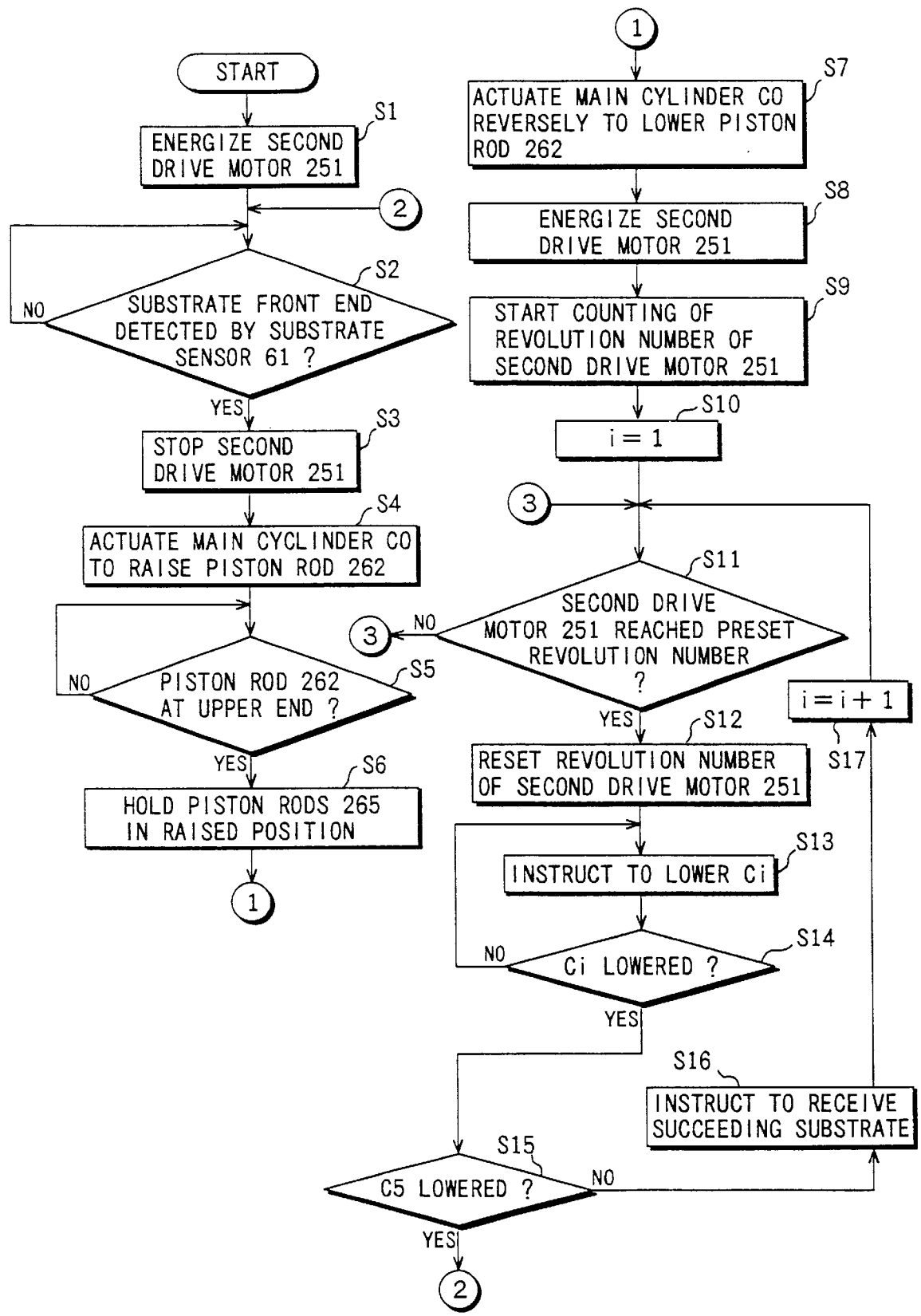
FIG. 14 is a flowchart showing one embodiment of transfer control executed by control means.

Control of the transfer operation by the control unit 5 will be described with reference to FIGS. 13 and 14 along with, as needed, FIGS. 8 to 11. FIG. 14 is a flowchart showing one embodiment of transfer control executed by the control unit 5. First, in step S1 of the flowchart shown in FIG. 14, the second drive motor 251 is switched on, whereupon the unit rollers R1–R5 set to the horizontal posture (FIG. 8) are rotated in synchronous relation, causing the substrate transfer section 220 to come into a completely ready state for receiving the substrate B.

Then, in step S2, the result detected by the substrate sensor 61 is determined. If the substrate sensor 61 detects the downstream (front) end of the substrate B, the control process goes to step S3. Thus, when the substrate B is detected in step S2, the energization of the second drive motor 251 is once stopped in next step S3, and the main cylinder C0 is actuated in subsequent step S4 to tilt the movable roller mount 230, thereby setting the roller group R to the inclined posture (FIG. 9).

Next, in step S5, the result detected by the rod position sensor 63 is determined. If it is confirmed that the piston rod 262 has reached a raised position set in advance, the control process goes to step S6.

Thus, when it is confirmed in step S5 that the piston rod 262 has reached the upper end position, compressed gas is supplied in step S6 from a gas source (not shown) to the sub-cylinders C1–C5. The piston rods 265 of the sub-cylinders C1–C5 are thereby held in the projected state.

Subsequently, in step S7, the main cylinder C0 is actuated reversely to lower the piston rod 262 for returning the movable roller mount 230 to the horizontal posture. The unit rollers R1–R5 are thereby held in the inclined posture by being supported by the piston rods 265 of the sub-cylinders C1–C5 only (FIG. 10).

Then, in step S8, the second drive motor 251 is energized again to carry the substrate B over the sub-cylinder group R toward the treating apparatus body 3 with resulting simultaneous rotation of the unit rollers R1–R5.

In next step S9, counting the revolution number of the second drive motor 251 is started. Thus, the revolution number sensor 62 starts counting the revolution number of the second drive motor 251 from this point in time. In step S10, an initial value "1" is set to a parameter 'i' indicating which one of the sub-cylinders C1–C5 is to be actuated. After that, it is determined in step S11 whether the counted result of the revolution number of the second drive motor 251 has reached a preset value or not, i.e., whether the counted result has reached or not the number of revolutions necessary for the upstream end of the substrate B pass the first sub-cylinder C1. If the preset revolution number is reached, the control process returns to step S11 again. If the counted result has reached the preset revolution number, step S12 is executed to reset the stored revolution number of the second drive motor 251 for restart of the counting.

Then, in step S13, an instruction of lowering the first sub-cylinder C1 is issued in accordance with the parameter "1", whereupon the first sub-cylinder C1 is actuated reversely to change the first unit roller R1 only to the horizontal posture (FIG. 11). This results in a condition where the substrate B may be carried from the substrate introducing station 210 to the substrate transfer section 220.

Subsequently, it is determined in step S14 from the result detected by the first rod sensor 641 whether the piston rod 265 of the first sub-cylinder C1 has reached the lower end position or not. If the lower end is not reached, the control process returns to step S13. If it is confirmed in step S14 that the piston rod 265 of the first sub-cylinder C1 has reached the lower end position, it is determined in step S15 whether the piston rod 265 of the fifth sub-cylinder C5 has reached the lower end position. If the parameter 'i' is any of "1 to 4" in step S15, a drive signal is not output to the fifth sub-cylinder C5, meaning that the fifth sub-cylinder C5 is not yet lowered. In this case, an instruction of receiving the succeeding substrate B is output in step S16 and, thereafter, step S17 is executed to perform counting to add "1" to the parameter 'i'. The control process then returns to step S11.

In this manner, steps S11 to S16 are repeated until reaching i=4. At the time the final i=5, i.e., that the piston rod 265 of the fifth sub-cylinder C5 has lowered, is confirmed in step S15, namely, at the time it is confirmed that the fifth sub-cylinder C5 is changed to the horizontal posture and hence the substrate B has passed the fifth unit roller R5, the control process returns to step S2 to repeat the transfer control for the succeeding substrate B. Thus, whenever the substrate B is carried into the substrate transfer section 220, steps S2 to S15 are executed so that the substrates B are each changed from the horizontal posture to the inclined posture with the control process of changing the posture of the unit rollers R1–R5 in the predetermined way as mentioned above, and then carried toward the treating apparatus body 3 one by one.

Though not shown in the flowchart of FIG. 14, when the sub-cylinders C1–C5 are actuated, it is detected by the first to fifth rod position sensors 641–645 whether their piston rods 265 have surely reached the upper or lower position or not. This makes it possible to always check whether the sub-cylinders C1–C5 are operating normally or not. If any of the sub-cylinders C1–C5 is not operating normally, measures such as stopping the apparatus are taken.

Figure 15A:
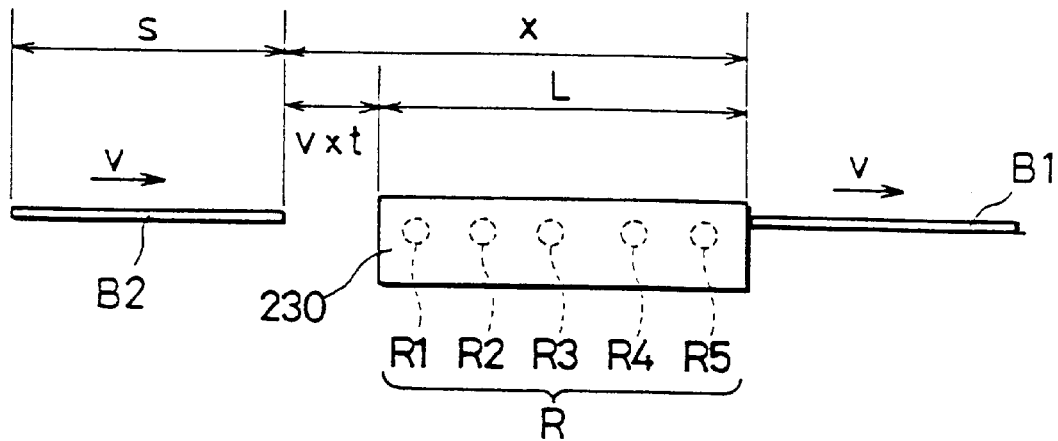
FIG. 15A shows the case where the unit rollers in the inclined posture are all changed to the horizontal posture at a time.
Figure 15B:
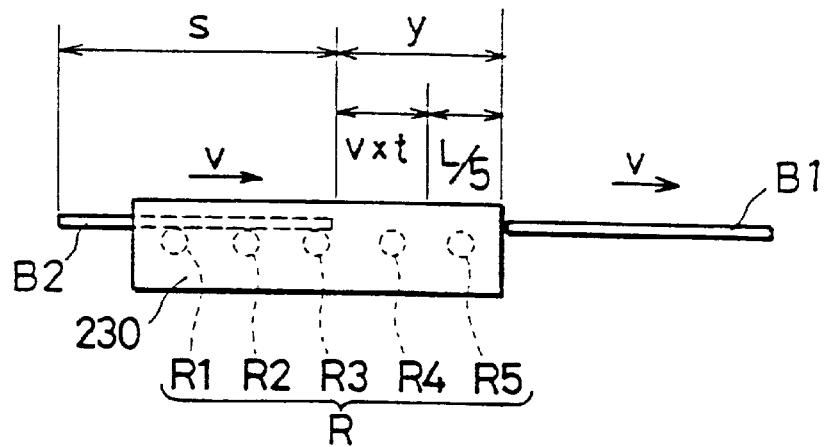
FIG. 15B shows the case where the unit rollers in the inclined posture are successively changed to the horizontal posture one by one.

FIG. 15 is a view for explaining the carrying time (tact time) of each substrate B over the substrate transfer section 220; FIG. 15A shows the case where the unit rollers R1–R5 in the inclined posture are all changed to the horizontal posture at a time, and FIG. 15B shows the case where the unit rollers R1–R5 in the inclined posture are successively changed to the horizontal posture one by one.

First, in the case of changing all the unit rollers R1–R5 to the horizontal posture at a time as shown in FIG. 15A, assuming that;

the length of the movable roller mount 230 is L (mm) (where L is set to 5 times the distance between the unit rollers), the length of the substrate B is s (mm), the carrying speed of the substrate B is v (mm/sec), the time required for raising and lowering the movable roller mount 230 is t (sec), and the distance between the substrates B being carried (the spacing between a first substrate B1 and a second substrate B2) is x (mm), there holds a relationship of x=L+vt. The time required for the second substrate B2 to pass the movable roller mount 230, i.e., the tact time T1 (sec), is given by:

$$T1=(x+s)/v=(L+vt+s)/v \qquad (1)$$

Next, in the case of successively changing the unit rollers R1–R5 to the horizontal posture one by one as shown in FIG. 15B, assuming that the distance between the substrates B being carried (the spacing between the first substrate B1 and the second substrate B2) is y (mm) and the other parameters are defined as with the above case of FIG. 15A, there holds a relationship of y=L/5+vt (where the number of unit rollers provided in the movable roller mount 230 is five). Then, the tact time T2 is given by:

$$T2=(y+s)/v=(L/5+vt+s)/v \qquad (2)$$

Accordingly, the difference between both the tact time T1 and T2 is given by:

$$T1-T2=(L+vt+s)/v-(L/5+vt+s)/v=4L/5v$$

In other words, it is understood that the case of changing all the unit rollers R1–R5 to the horizontal posture at a time takes (4 L/5 v) seconds longer than the case of successively changing the unit rollers R1–R5 to the horizontal posture one by one.

In this embodiment, the aforementioned parameters are set to L=750 (mm), s=650 (mm), v=25 (mm/sec) and t=4 (sec). Substituting these values into the above equation (1), we get:

$$T1=(750+25\times4+650)/25=60 \text{ seconds}$$

Thus, when the substrate B is transferred by changing all the unit rollers R1–R5 in the inclined posture to the horizontal posture at a time, it requires 60 seconds for the substrate to pass the substrate transfer section 230.

On the contrary, when the substrate B is transferred by successively changing the unit rollers R1–R5 in the inclined posture to the horizontal posture one by one from the upstream side, substituting the above values into the above equation (2) results in:

$$T2=(750/5+25\times4+650)/25=36 \text{ seconds}$$

Accordingly, in comparison with the case of changing all the unit rollers R1–R5 to the horizontal posture at a time, the time required for the substrate B to pass the substrate transfer section 220 can be cut down 24 seconds in the case of successively changing the unit rollers R1–R5 to the horizontal posture one by one.

With the substrate treating apparatus 1a of the second embodiment, as described above, the substrate transfer section 220 and an outlet side transfer unit are disposed respectively upstream and downstream of the treating apparatus body 3 in which the substrate B is subjected to certain treatment while being carried in an inclined posture therethrough. In the substrate transfer section 220, the roller group R (sub-cylinder group C) for supporting and carrying the substrate B is provided to be able to change its posture between a horizontal posture and an inclined posture at a time by operation of the main cylinder C0, and the unit rollers R1–R5 are constructed to be able to change a posture independently of each other by the sub-cylinders C1–C5. In the outlet side transfer unit, the posture changing operation is performed in a like manner (but, from the operating point of view, the outlet side transfer unit differs from the substrate transfer section 220 in that the substrate B is delivered to a next step after being changed from an inclined posture to a horizontal posture). Therefore, by receiving the substrate B onto the roller group R in the substrate transfer section 220 while maintaining the posture of the substrate B carried from the upstream side, actuating the main cylinder C0 to change the posture of the roller group R at a time to a posture in agreement with the carrying posture of the substrate B on the downstream side, and then successively returning the posture of the unit rollers R1–R5 (sub-cylinders C1–C5) one by one, which has been passed by the rear end of the substrate B, to the carrying posture of the substrate B on the upstream side, it is possible to receive the succeeding substrate B on the substrate transfer section 220 in a condition where the preceding substrate B is still present on the substrate transfer section 220. This is very effective in cutting down the tact time required for the substrate B to pass the substrate transfer section 220.

The following tests were made to confirm a suitable inclination angle of the substrate carried in an inclined posture.

(1) Test for Checking Replacement Efficiency of Treating Liquid

An alkaline cleaning chemical (25° C.) was put on each of a plurality of hydrophilic substrates made of plain glass and being 360 mm long×465 mm wide×1.1 mm thick, and cleaning water was showered at a flow rate of 5 liters/min to the substrates which were held in inclined postures at different angles. At the time the pH value of the cleaning water flowing down from the substrates became 7, this was regarded as the completion of cleaning (i.e., the completion of liquid replacement) and supply of the cleaning water was stopped. During the above process, the time taken from the start of supply of the cleaning water to the stop of supply thereof was measured for each of the substrates in various inclined postures. Test results are shown in Table 1.

TABLE 1

| Inclination angle (°) | 0 | 3 | 5 | 10 | 20 | 40 | 60 | 80 | 90 |
|---|---|---|---|---|---|---|---|---|---|
| Showering time (sec) | 10 | 7 | 5 | 5 | 5 | 4 | 4 | 3 | 3 |

As seen from Table 1, it takes 10 seconds for the treating liquid to be replaced by different one when the substrate is in a horizontal posture with the inclination angle of 0° and, therefore, the efficiency of liquid replacement cannot be said good. At the inclination angle of 3°, the liquid replacement is completed in 7 seconds and the time required for the liquid replacement is cut down by 30% in comparison with the inclination angle of 0°, i.e., the horizontal posture. Then, even when the inclination angle is increased from 3°, the water supply time is shortened just a little by a little. It is thus understood that the inclination angle of at least 3° is required.

(2) Test for Checking Wiping of Treating Liquid

A plurality of substrates made of glass coated with a chromium film and having the same size as above were prepared, and an alkaline cleaning chemical (25° C.) was put on the surface of each of the substrates. After that, the substrates were held in inclined postures at different angles for 10 seconds and returned to a horizontal posture. The amount of the cleaning chemical remaining on the surface of each substrate was then measured. Measured results are shown in Table 2.

TABLE 2

| A | 0 | 3 | 5 | 10 | 20 | 40 | 60 | 80 | 90 |
|---|---|---|---|---|---|---|---|---|---|
| B | 290 | 49.5 | 25.4 | 17.1 | 11.5 | 7.9 | 7.3 | 6.8 | 6.5 |

(A) Inclination angle (°)
(B) Amount of remained cleaning chemical (g)

As seen from Table 2, 290 g of the cleaning chemical remains on the substrate when it is in a horizontal posture with the inclination angle of 0°, whereas the amount of the remained cleaning chemical is 48.9 g at the inclination angle of 3°, which corresponds to a reduction of 83%. Then, as the inclination angle increases from 3°, the residual amount is reduced gradually. It is thus understood that the inclination angle of at least 3° is preferable.

(3) Test for Checking Resistance to Drying-up of Treating Liquid

Two types of substrates made of plain glass (hydrophilic substrates) and glass coated with a chromium film (hydrophobic substrates) and having the same size as above were prepared in plural for each type, and pure water (25° C.) was put on the surface of each of the substrates. After that, the substrates were held in inclined postures at different angles for 10 seconds and returned to a horizontal posture. The time taken for a drying-up area, which was gradually formed from an edge of each substrate, to spread to a point 50 mm inwardly of the edge was then measured. Measured results are shown in Table 3.

TABLE 3

| A | 0 | 2 | 5 | 10 | 20 | 40 | 60 | 80 | 90 |
|---|---|---|---|---|---|---|---|---|---|
| B C | >999 | 18.9 | 14.6 | 9.9 | 9.6 | 9.8 | 9.7 | 9.6 | 9.6 |
| D | >999 | 7.0 | 5.4 | 5.0 | 4.5 | 4.2 | 4.2 | 4.1 | 4.1 | where
(A) Inclination angle (°)
(B) Time required for the drying-up area to spread (sec)
(C) hydrophilic
(D) hydrophobic As seen from Table 3, when the inclination angle is 5° or less, it takes 5.4 seconds or more for the substrate to dry up and, therefore, the substrate is surely prevented from drying up completely from the correlation with the carrying speed of the substrate. Accordingly, it is preferable to set the inclination angle to be 5° or less from the standpoint of effectively suppressing drying-up of the treating liquid on the substrate.

(4) Test for Checking Re-adhesion of Particles on Substrate

Two types of substrates, i.e., hydrophilic substrates and hydrophobic substrates similar to those used above, were prepared in plural for each type and cleaned beforehand. Then, the substrates were held in inclined postures at different angles and pure water (25° C.) was showered to the surface of each of the substrates for water cleaning using brushes. After drying the substrate surface with an air knife, the number of particles adhering onto the substrate surface was counted. Test results are shown in Table 4.

TABLE 4

| A | 0 | 2 | 5 | 10 | 20 | 40 | 60 | 80 | 90 |
|---|---|---|---|----|----|----|----|----|----|
| B C | 1 | 0 | 1 | 2 | 1 | 3 | 3 | 7 | 8 |
| D | 3 | 5 | 4 | 4 | 5 | 8 | 12 | 17 | 19 | where
(A) Inclination angle (°)
(B) Number of particles increased
(C) hydrophilic
(D) hydrophobic As seen from Table 4, in the hydrophobic substrates which are more likely to partly dry up, the number of particles is increased 12 when the inclination angle of the substrate is 60°, whereas an increase in the number of particles is reduced to 8 when the inclination angle is 40°. Further, there is a tendency that as the inclination angle decreases gradually, the number of adhering particles is reduced. It is thus understood that the inclination angle of the substrate is preferably 40° or less.

(5) Test for Checking Load Imposed on Center Roller

A plurality of hydrophilic substrates similar to those used above were prepared. Then, the substrates were held in inclined postures at different angles and a film of pure water (25° C.) was formed on the surface of each of the substrates. The thickness of the formed film was measured and the load imposed on the center roller was calculated from the measured value. Test results are shown in Table 5.

TABLE 5

| Inclination angle (°) | 0 | 2 | 5 | 10 | 20 | 40 | 60 | 80 | 90 |
|---|---|---|---|----|----|----|----|----|----|
| Center roller load (N) | 2.1 | 1.8 | 1.6 | 1.3 | 1.0 | 0.7 | 0.4 | 0.1 | 0 |

As seen from Table 5, when the inclination angle of the substrate is 20° or more, the load imposed on the center roller is diminished. It is thus understood that, from the viewpoint of the load imposed on the center roller, the inclination angle of the substrate is preferably 20° or more.

(6) Test for Checking Stability in Carrying of Substrate

A plurality of hydrophilic substrates similar to those used above were prepared. Then, the substrates were held in inclined postures at different angles and pure water (25° C.) was ejected toward the surface of each of the substrates. A test for visually observing a flexing condition of the substrate and checking locations at which the substrate was required to be supported, was conducted. Test Results are Shown in Table 6.

TABLE 6

| A | | 0 | 2 | 5 | 10 | 20 | 40 | 60 | 80 | 90 |
|---|---|---|---|---|----|----|----|----|----|----|
| B | | 3 | 2 | 2 | 2 | 2 | 2 | 3 | 4 | 4 |
| C | D | no | no | no | no | no | no | yes | yes | yes |
|   | E | yes | yes | yes | yes | yes | yes | yes | yes | yes |
|   | F | yes | yes | yes | yes | yes | yes | yes | yes | yes |
|   | G | yes | no | no | no | no | no | yes | yes | yes | where
(A) Inclination angle (°)
(B) Number of locations at which the substrate is required to be supported
(C) Locations
(D) front surface
(E) rear surface
(F) lower side of the substrate
(G) upper side of the substrate and in the above table "yes" means that the substrate is required to be supported whereas "no" means that it is not required to be supported As seen from Table 6, it was confirmed that the substrate is not required to be supported at the front surface when the inclination angle of the substrate is in the range of 3° to 40°. From the test results mentioned above, it is understood that the inclination angle of the substrate is preferably in the range of 3° to 40°, more preferably in the range of 3° to 7°.

According to the present invention, as described above in detail, since the substrate B is carried in an inclined posture through the treating apparatus body 3, it is not required, unlike the case of carrying the substrate in a horizontal posture through the treating apparatus body 3, to provide an additional liquid removing space to prevent treating liquids of different kinds used in adjacent tanks from mixing with each other on the front and rear surfaces of the substrate B, or to install a separate equipment for liquid wiping. Correspondingly, the equipment cost can be reduced. Further, the chemical and the cleaning water flow down fast over the inclined substrate, while providing a high cleaning action, in the chemical cleaning station 31 and the water cleaning station 32, respectively. Therefore, the time necessary for the cleaning, i.e., the time required for the substrate to pass the station 31 or 32, is cut down. In other words, if the carrying speed is constant, the size of the chemical cleaning station 31 and the water cleaning station 32 can be reduced. With a combination of these features, the length of the treating apparatus body 3 can be shortened as a whole, which contributes to a reduction in space necessary for installation. Additionally, gas which has been employed in the past to remove the liquid from the substrate B between adjacent tanks can be dispensed with, which contributes to a reduction in the operating cost.

Furthermore, since the rollers 51 are inclined, the substrate B on the rollers 51 is supported by only the lower flanges 53b of the rollers 51 while being prevented from slipping off, and hence the substrate B can be supported on the rollers 51 regardless of its width dimension. Thus, by setting the lower flanges 53b as a reference position for carrying the substrate B, it is possible to carry and treat the substrate B by the rollers 51 regardless of the substrate size, and to effectively improve versatility of the apparatus.

In addition, the substrate introducing station 2, 2a is disposed upstream of the treating apparatus body 3 to change the posture of the substrate B, which has been carried in a horizontal posture, to an inclined posture, and the substrate delivering station is disposed downstream of the treating apparatus body 3 to return the substrate B from the inclined posture to the horizontal posture. Thus, in order that the substrate B is subjected to treatment in the inclined posture through the treating apparatus body 3, it is not required to modify the whole of the carrying unit upstream and downstream of the treating apparatus body 3 so as to be able to carry the substrate B in the inclined posture. This is very effective in reducing the equipment cost in its entirety.

Moreover, since the carrying surface of the substrate B in the treating apparatus body 3 is inclined in the range of 3° to 40° relative to the horizontal direction in a plane perpendicular to the carrying direction of the substrate B, the substrate B can be carried in a stable state when its inclination angle is within the above range. Also, by adequately setting the inclination angle of the substrate B to fall in the above range in consideration of the kind of the treating liquid, the viscosity of the treating liquid, the amount of the treating liquid supplied, the carrying speed of the substrate B, etc., the treating liquid can be replaced and removed satisfactorily, while preventing the surface of the substrate B from drying up and ensuring a sufficient treatment effect.

Additionally, by setting the inclination angle of the carrying surface of the substrate B to fall in the range of 3° to 7°, even when the treating liquid is a chemical having a low concentration or treating water such as pure water, for example, it is also possible to satisfactorily replace the treating liquid by fresh one and wipe the same from the substrate B, while preventing the surface of the substrate B from drying up and achieving a sufficient treatment effect (cleaning effect).

It should be understood that the present invention is not limited to the embodiments described above, but also includes the following modifications as well.

(1) While the above embodiments employ a roller conveyor as the carrying unit 5, the present invention is not limited to the use of a roller conveyor as the carrying unit 5, and a belt conveyor or a wire conveyor may be employed as the carrying unit 5. Partly supporting rollers similar to those 53 used in the treating apparatus body 3 may also be employed in the substrate introducing station 2 and the substrate delivering station 4.

(2) In the above embodiments, various nozzles are disposed in the treating apparatus body 3 above and below the carrying unit 5 in sandwiching relation. However, those nozzles may be disposed only above the carrying unit 5.

(3) While, in the above embodiments, the drying station 37 is disposed downstream of the water cleaning station 32 in the treating apparatus body 3, the present invention is not limited to such an arrangement of the drying station 37 downstream of the water cleaning station 32. For example, when the so-called spinner, in which the substrate B is fixed onto a disk and rotated at a high speed about a vertical axis so as to blow off the liquid with centrifugal forces for drying it, is used as a drying unit, it is preferable to employ such a layout that the substrate delivering station 4 is disposed downstream of the water cleaning station 32 and the spinner is disposed downstream of the substrate delivering station 4.

(4) In the above embodiments, the fulcrums about which the roller support member 23 and the movable roller mount 230 are turned are disposed on the lower side of the inclined transferring path so that the roller support member 23 and the movable roller mount 230 can be turned about the fulcrums forward and backward to change their postures. However, those fulcrums may be disposed instead on the upper side of the inclined transferring path so that the roller support member 23 and the movable roller mount 230 can be turned about the fulcrums to change their postures.

(5) While, in the above embodiments, the plurality of rollers 51 and unit rollers R1–R5 are arranged side by side in the substrate transfer sections 22, 220, a plurality of unit transfer unit each constructed by stretching a belt between a pair of rollers may be disposed in place of the rollers 51 and the unit rollers R1–R5.

(6) In the above second embodiment, the inlet side substrate transfer section 220 disposed upstream of the treating apparatus body 3 is described in detail with reference to FIGS. 10 to 15, but an outlet side substrate transfer section having the same structure is also disposed downstream of the treating apparatus body 3. In this case, however, the operation is performed in a reversed manner to the above second embodiment. Specifically, the sub-cylinder group C (roller group R) is set to the inclined posture in an initial state and then changed to the horizontal posture at a time whenever the substrate B is carried from the treating apparatus body 3 to the outlet side substrate transfer section. After that, as the substrate B advances, the sub-cylinders C1–C5 (unit rollers R1–R5) are successively returned to the inclined posture one by one from the upstream side.

(7) While the above second embodiment employs, as posture changing unit, the main cylinder C0 utilizing gas pressure, posture changing unit utilizing a link mechanism may be employed in place of the main cylinder C0.

(8) While the above second embodiment employs, as posture restoring unit, the plurality of sub-cylinders C1–C5 utilizing gas pressure, posture restoring unit utilizing a link mechanism may be employed in place of each of the sub-cylinders C1–C5.

(9) In the above second embodiment, the main cylinder C0 and the sub-cylinders C1–C5 are disposed below the movable roller mount 230, and the movable roller mount 230 and the unit rollers R1–R5 are supported from below by the piston rods 262, 265 of those cylinders. However, the main cylinder and the sub-cylinders C1–C5 may be hanged instead from a frame disposed above the movable roller mount 230, and the movable roller mount 230 and the unit rollers R1–R5 may be supported by the piston rods of those cylinders in a suspended fashion.

(10) While the above second embodiment employs the sub-cylinders C1–C5 in one-to-one relation to the unit rollers R1–R5, a plurality of unit rollers may be associated with each of the sub-cylinders C1–C5. This enables the number of the unit rollers R1–R5 on the movable roller mount 230 to be increased, resulting in more stable transfer operation.

(11) In the above second embodiment, the distance through which the substrate B has advanced by the unit rollers R1–R5 is detected based on the number of revolutions of the second drive motor 251. However, the distance through which the substrate B has advanced may be detected instead by providing position sensors for detecting advance of the substrate B at appropriate locations on the movable roller mount 230.

(12) While the above second embodiment employs the main cylinder C0 as posture changing unit, only the sub-cylinders C1–C5 may be provided without providing the main cylinder C0 and may be actuated to change their postures at a time or separately one by one by supplying gas under high pressure to the sub-cylinders C1–C5 in a switchable way.

(13) While the above second embodiment employs the cylindrical rollers 52 as the unit rollers R1–R5, the partly supporting rollers 53 used in the treating apparatus body 3 may also be employed instead.

(14) While the above embodiments described a substrate treatment by way of cleaning operation as an example. However, the substrate treatment can be a development, an etching, or a removing treatment. Thus the term "treatment" in this description should not be interpreted narrowly by the specific example given in the above embodiments.

Although the present invention has been fully described by way of examples with reference to the accompanied drawings, it is to be understood various changes and modifications will be apparent to those skilled in the art without departing from the spirit and the scope of the invention. Accordingly, the invention should not be limited by the foregoing description but rather should be defined only by the following claims.

What is claimed is:

1. A substrate treating apparatus for treating substrates successively, comprising:

a body including carrying means for carrying said substrate along a carrying surface which is inclined in a plane perpendicular to the carrying direction of said substrate, said body supplying a treating liquid to said substrate being carried for treating said substrate;

a receiving station disposed upstream of said body for changing a posture of said substrate forwarded in a horizontal posture to an inclined posture corresponding to the inclination of said carrying surface and forwarding said substrate onto said carrying means, said receiving station having:

a plurality of carrying members arranged side by side in the carrying direction for moving said substrate in the carrying direction;

a support member for supporting said carrying members;

drive means for driving said carrying members;

a posture changing means for changing said support member from the horizontal posture, which corresponds to the posture of said substrate upstream of said substrate treating apparatus, to the inclined posture; and a delivering station disposed downstream of said body for returning said substrate forwarded from said carrying means in the inclined posture to the horizontal posture.

2. A substrate treating apparatus according to claim 1, wherein the carrying surface defined by said carrying means is inclined in a range of 3° to 40° relative to a horizontal direction in the plane perpendicular to the carrying direction of said substrate.

3. A substrate treating apparatus according to claim 1, wherein said apparatus further comprises posture restoring means for returning individual carrying members of said plurality of carrying members, set to the inclined posture, to the horizontal posture.

4. A substrate treating apparatus according to claim 3, wherein said posture restoring means has sub-cylinder devices, and said sub-cylinder devices have piston rods, said piston rods are set free of displacement, while said posture changing means changes said carrying members from the horizontal posture to the inclined posture.

5. A substrate treating apparatus according to claim 4, wherein said posture restoring means successively return said carrying members, one-by-one from the upstream side, from the inclined posture to the horizontal posture.

6. A substrate treating apparatus according to claim 5, wherein said posture restoring means include detecting means for detecting that the rear end of said substrate has passed the respective carrying members, and one or more of said carrying members which have been passed by said substrate are changed from the inclined posture to the horizontal posture in accordance with a detection signal of passage of said substrate by said detecting means.

7. A substrate treating apparatus according to claim 5, wherein said carrying members are carrying rollers, said support member is a roller mount on which said plurality of carrying rollers are arranged side-by-side in the carrying direction of said substrate to be rotatable about axes of respective roller shafts, and said posture changing means is a main cylinder device having a piston rod which extends out from or contracts into a cylinder to change posture of said roller mount between a horizontal posture and an inclined posture, said roller mount being rotatably supported at one side thereof by a horizontal shaft extending in the carrying direction of said substrate.

8. A substrate treating apparatus according to claim 7, wherein said roller shafts are supported in a free state by a side edge of said roller mount opposite to the side of said horizontal shaft.

9. A substrate treating apparatus according to claim 8, wherein ends of said roller shafts on the side of said horizontal shaft are connected to said drive means through flexible couplings.

10. A substrate treating apparatus according to claim 1, wherein said treating liquid is a cleaning chemical.

11. A substrate treating apparatus for treating substrates successively, comprising:

a body including carrying means for carrying said substrate along a carrying surface which is inclined in a plane perpendicular to the carrying direction of said substrate, said body supplying a treating liquid to said substrate being carried for treating said substrate;

a receiving station disposed upstream of said body for changing a posture of said substrate forwarded in a horizontal posture to an inclined posture corresponding to the inclination of said carrying surface and forwarding said substrate onto said carrying means; and a delivering station disposed downstream of said body for returning said substrate forwarded from said carrying means in the inclined posture to the horizontal posture, said delivering station having:

a plurality of carrying members arranged side by side in the carrying direction for moving said substrate in the carrying direction;

a support member for supporting said carrying members;

drive means for driving said carrying means; and posture changing means for changing said support member from the inclined posture, which corresponds to the posture of said substrate downstream of said substrate treating apparatus, to the horizontal posture.

12. A substrate treating apparatus according to claim 11, wherein said apparatus further comprises posture restoring means for returning individual carrying members of said plurality of carrying members, set to the horizontal posture, to the inclination posture.

13. A substrate treating apparatus according to claim 12, wherein said posture restoring means have sub-cylinder devices, and said sub-cylinder devices have piston rods, said piston rods are set free of displacement, while said posture changing means changes said carrying members from the inclined posture to the horizontal posture.

14. A substrate treating apparatus according to claim 13, wherein said posture restoring means successively return said carrying members, one-by-one from the upstream side, from the horizontal posture to the inclined posture.

15. A substrate treating apparatus according to claim 14, wherein said posture restoring means include detecting means for detecting that the rear end of said substrate has passed the respective carrying members, and corresponding carrying members which have been passed by said substrate are changed from the horizontal posture to the inclined posture in accordance with detection signal indicating passage of said substrate by said detecting means.

16. A substrate treating apparatus according to claim 14, wherein said carrying members are carrying rollers, said support member is a roller mount on which said plurality of carrying rollers are arranged side-by-side in the carrying direction of said substrate to be rotatable about axes of respective roller shafts, and said posture changing means is a main cylinder device having a piston rod which extends from or contracts into a cylinder to change posture of said roller mount between a horizontal posture and an inclined posture, said roller mount being supported at one side thereof by a horizontal shaft extending in the carrying direction of said substrate turnable about the axis of said horizontal shaft, said roller shafts being supported in a free state by a side edge of said roller mount opposite to the side in which said horizontal shaft is provided.

17. A substrate treating apparatus according to claim 16, wherein said side edge has upwardly opening slots provided therein for supporting said roller.

18. A substrate treating apparatus according to claim 17, wherein ends of said roller shafts on the side of said horizontal shaft are connected to said drive means through flexible couplings.

19. A substrate treating apparatus according to claim 11, wherein the carrying surface defined by said carrying means is inclined in a range of 3° to 40° relative to a horizontal direction in the plane perpendicular to the carrying direction of said substrate.

20. A substrate treating apparatus according to claim 11, wherein said treating liquid is a cleaning chemical.

21. A substrate treating apparatus for treating substrates successively, comprising:

a body including a carrying unit for carrying said substrate along a carrying surface which is inclined in a plane perpendicular to the carrying direction of said substrate, said body supplying a treating liquid to said substrate being carried for treating said substrate;

a receiving station disposed upstream of said body for changing posture of said substrate forwarded in a horizontal posture to an inclined posture corresponding to the inclination of said carrying surface and forwarding said substrate onto said carrying unit, said receiving station having:

a plurality of carrying members arranged side-by-side in the carrying direction for moving said substrate in the carrying direction;

a support member for supporting said carrying members;

a drive motor for driving said carrying members;

a posture changing device for changing said support member from the horizontal posture, which corresponds to the posture of said substrate upstream of said substrate treating apparatus, to the inclined posture; and a delivering station disposed downstream of said body for returning said substrate forwarded from said carrying unit in the inclined posture to the horizontal posture.

22. A substrate treating apparatus according to claim 21, wherein the carrying surface defined by said carrying unit is inclined in a range of 3° to 40° relative to a horizontal direction in the plane perpendicular to the carrying direction of said substrate.

23. A substrate treating apparatus according to claim 22, wherein said treating liquid is a cleaning chemical.

24. A substrate treating apparatus according to claim 21, wherein said apparatus further comprises a posture restoring device for returning individual carrying members of said plurality of carrying members, set to the inclined posture, to the horizontal posture.

25. A substrate treating apparatus according to claim 24, wherein said posture restoring device has sub-cylinder devices, and said sub-cylinder devices have piston rods, said piston rods are set free of displacement, while said posture changing device changes said carrying members from the horizontal posture to the inclined posture.

26. A substrate treating apparatus according to claim 25, wherein said posture restoring device successively returns said carrying members, one-by-one from the upstream side, from the inclined posture to the horizontal posture.

27. A substrate treating apparatus according to claim 26, wherein said posture restoring device includes a detecting device to detect that the rear end of said substrate has passed the respective carrying members, and one or more of said carrying members which have been passed by said substrate are changed from the inclined posture to the horizontal posture in accordance with a detection signal from said detecting device indicating passage of said substrate.

28. A substrate treating apparatus according to claim 26, wherein said carrying members are carrying rollers, said support member is a roller mount on which said plurality of carrying rollers are arranged side-by-side in the carrying direction of said substrate to be rotatable about axes of respective roller shafts, and said posture changing device is a main cylinder device having a piston rod which extends out from or contracts into a cylinder to change posture of said roller mount between a horizontal posture and an inclined posture, said roller mount being rotatably supported at one side thereof by a horizontal shaft extending in the carrying direction of said substrate.

29. A substrate treating apparatus according to claim 28, wherein said roller shafts are supported in a free state by a side edge of said roller mount opposite to the side of said horizontal shaft.

30. A substrate treating apparatus according to claim 29, wherein ends of said roller shafts on the side of said horizontal shaft are connected to said drive motor through flexible couplings.

31. A substrate treating apparatus for treating substrates successively, comprising:

a body including a carrying unit for carrying said substrate along a carrying surface which is inclined in a plane perpendicular to the carrying direction of said substrate, said body supplying a treating liquid to said substrate being carried for treating said substrate;

a receiving station disposed upstream of said body for changing posture of said substrate forwarded in a horizontal posture to an inclined posture corresponding to the inclination of said carrying surface and forwarding said substrate onto said carrying unit; and a delivering station disposed downstream of said body for returning said substrate forwarded from said carrying unit in the inclined posture to the horizontal posture, said delivering station having:

a plurality of carrying members arranged side-by-side in the carrying direction for moving said substrate in the carrying direction;

a support member for supporting said carrying members;

a drive motor to drive said carrying unit, and a posture changing device for changing said support member from the inclined posture, which corresponds to the posture of said substrate downstream of said substrate treating apparatus, to the horizontal posture.

32. A substrate treating apparatus according to claim 31, wherein said apparatus further comprises a posture restoring device for returning individual carrying members of said plurality of carrying members, set to the horizontal posture, to the inclination posture.

33. A substrate treating apparatus according to claim 32, wherein said posture restoring device has sub-cylinder devices, and said sub-cylinder devices have piston rods, said piston rods are set free of displacement, while said posture changing device changes said carrying member from the inclined posture to the horizontal posture.

34. A substrate treating apparatus according to claim 33, wherein said posture restoring device successively returns said carrying members, one-by-one from the upstream side, from the horizontal posture to the inclined posture.

35. A substrate treating apparatus according to claim 34, wherein said posture restoring device includes a detecting device to detect that the rear end of said substrate has passed the respective carrying members, and corresponding carrying members which have been passed by said substrate are changed from the horizontal posture to the inclined posture in accordance with a detection signal from said detecting device indicating passage of said substrate.

36. A substrate treating apparatus according to claim 34, wherein said carrying members are carrying rollers, said support member is a roller mount on which said plurality of carrying rollers are arranged side-by-side in the carrying direction of said substrate to be rotatable about axes of respective roller shafts, and said posture changing device is a main cylinder device having a piston rod which extends out from or contracts into a cylinder to change posture of said roller mount between a horizontal posture and an inclined posture, said roller mount being supported at one side thereof by a horizontal shaft extending in the carrying direction of said substrate turnable about the axis of said horizontal shaft, said roller shafts being supported in a free state by a side edge of said roller mount opposite to the side in which said horizontal shaft is provided.

37. A substrate treating apparatus according to claim 36, wherein said side edge has upwardly opening slots provided therein for supporting said roller.

38. A substrate treating apparatus according to claim 37, wherein ends of said roller shafts on the side of said horizontal shaft are connected to said drive motor through flexible couplings.

39. A substrate treating apparatus according to claim 31, wherein the carrying surface defined by said carrying unit is inclined in a range of 3° to 40° relative to a horizontal direction in the plane perpendicular to the carrying direction of said substrate.

40. A substrate treating apparatus according to claim 31, wherein said treating liquid is a cleaning chemical.

* * * * *